US010756004B1

(12) United States Patent
Elsherbini et al.

(10) Patent No.: US 10,756,004 B1
(45) Date of Patent: Aug. 25, 2020

(54) QUANTUM COMPUTING ASSEMBLIES WITH THROUGH-HOLE DIES

(71) Applicant: INTEL CORPORATION, Santa Clara, CA (US)

(72) Inventors: Adel A. Elsherbini, Chandler, AZ (US); Javier A. Falcon, Chandler, AZ (US); David J. Michalak, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/368,483

(22) Filed: Mar. 28, 2019

(51) Int. Cl.
*H01L 23/48* (2006.01)
*H01L 25/00* (2006.01)
*H01L 39/04* (2006.01)
*H01L 25/065* (2006.01)
*H01L 25/18* (2006.01)
*G06N 10/00* (2019.01)

(52) U.S. Cl.
CPC .......... *H01L 23/481* (2013.01); *G06N 10/00* (2019.01); *H01L 25/0657* (2013.01); *H01L 25/18* (2013.01); *H01L 25/50* (2013.01); *H01L 39/045* (2013.01); *H01L 2225/06513* (2013.01); *H01L 2225/06517* (2013.01); *H01L 2225/06537* (2013.01); *H01L 2225/06541* (2013.01); *H01L 2225/06582* (2013.01); *H01L 2225/06589* (2013.01)

(58) Field of Classification Search
CPC ... H01L 23/481; H01L 25/0657; H01L 25/18; H01L 39/045; H01L 25/50; H01L 2225/06537; H01L 2225/06589; H01L 2225/06513; H01L 2225/06517; H01L 2225/06582; H01L 2225/06541; G06N 10/00

See application file for complete search history.

(56) References Cited

U.S. PATENT DOCUMENTS

| 2012/0074386 A1 | 3/2012 | Rachmady et al. |
| 2013/0264617 A1 | 10/2013 | Joshi et al. |
| 2018/0013052 A1* | 1/2018 | Oliver ................. H01L 25/0652 |

OTHER PUBLICATIONS

"A Nanodamascene Process for Advanced Single-Electron Transistor Fabrication," Dubuc et al, IEEE Transactions on Nanotechnology, vol. 7, No. 1, Jan. 2008, pp. 68-73.
"A two-qubit logic gate in silicon," Veldhorst et al., Nature, vol. 526, Oct. 15, 2015, pp. 410-414.
"Gate-Defined Quantum Dots in Intrinsic Silicon," Angus et al., Nano Letters 2007, vol. 7, No. 7, 2051-2055, publication date Jun. 14, 2007, retrieved from http://pubs.acs.org on Mar. 31, 2009, 6 pages.

(Continued)

*Primary Examiner* — Kyoung Lee
(74) *Attorney, Agent, or Firm* — Patent Capital Group

(57) ABSTRACT

Quantum computing assemblies with through-hole dies, and related devices and methods, are disclosed herein. For example, in some embodiments, a quantum computing assembly may include a package substrate, a quantum processing die, and a through-hole die between the package substrate and the quantum processing die, wherein the quantum processing die is electrically coupled to the package substrate by interconnects extending through throughholes of the through-hole die.

20 Claims, 12 Drawing Sheets

(56) References Cited

OTHER PUBLICATIONS

"Independent, extensible control of same-frequency superconducting qubits by selective broadcasting," Asaad et al., Netherlands Organisation for Applied Scientific Research, Aug. 28, 2015, 17 pages.
"Fast sensing of double-dot charge arrangement and spin state with an rf sensor quantum dot," Barthel et al, Materials Department, University of California, Santa Barbara, Jan. 16, 2014, 4 pages.
"Undoped accumulation-mode Si/SiGe quantum dots," Borselli et al, HRL Laboratories, LLC., Jul. 15, 2014, 4 pages.
"Multilayer microwave integrated quantum circuits for scalable quantum computing," Brecht et al, Department of Applied Physics, Yale University, Sep. 4, 2015, 5 pages.
"Reducing intrinsic loss in superconducting resonators by surface treatment and deep etching of silicon substrates," Bruno, et al., QuTech Advanced Research Center and Kavli Institute of Nanoscience, Delft University of Technology, the Netherlands, Feb. 16, 2015, 9 pages.
"Spin Relaxation and Decoherence of Holes in Quantum Dots," Bulaev et al., Phys. Rev. Lett. 95, 076805, Aug. 11, 2005, 1 page.
"Fundamentals of Silicon Material Properties for Successful Exploitation of Strain Engineering in Modern CMOS Manufacturing," Chidambaram et al, IEE Transactions on Electron Devices, vol. 53, No. 5, May 2006, pp. 944-964.
"Ultrafast optical control of individual quantum dot spin qubits," De Greve et al, Reports on Progress in Physics, vol. 76, No. 9, Sep. 4, 2013, 2 pages.
"Fabrication and Characterization of Sidewall Defined Silicon-on-Insulator Single-Electron Transistor," Jung et al., IEEE Transactions on Nanotechnology, vol. 7, No. 5, Sep. 2008, pp. 544-550.
"How it's built: Micron/Intel3D Nand Micron Opens the Veil a Little," Moyer, Bryon, retrieved from https://www.eejournal.com/article/20160201-micron/ on Nov. 29, 2017, 9 pages.
"Investigation of Vertical Type Single-Electron Transistor with Sidewall Spacer Quantum Dot," Kim et al, Student Paper, Inter-University Semiconductor Research Center and School of Electrical Engineering and Computer Science, Seoul National University, ISDRS 2011, Dec. 7-9, 2011, ISDRS 2011—http://www.ece.umd.edu/ISDRS2011, 2 pages.
"Platinum single-electron transistors with tunnel barriers made by atomic layer deposition", George et al., Department of Electrical Engineering, University of Notre Dame, Received Jul. 7, 2010:Published Nov. 5, 2010, 3 pages.
"Surface loss simulations of superconducting coplanar waveguide resonators," Wenner et al, Applied Physics Letters 99, 113513 (2011), pp. 113513-1 through 3.
"Quantum computation with quantum dots," Loss et al, Physical Review A, vol. 57, No. 1, Jan. 1998, pp. 120-126.
"Ultafast high-fidelity initialization of a quantum-dot spin qubit without magnetic fields," Mar et al., Phys. Rev. B 90 241303®, published Dec. 15, 2014, 1 page.
"Magnetic field tuning of coplanar waveguide resonators," Healey, et al., Applied Physics Letters 93, 043513 (2008), pp. 043513-1 through 3 (4 pages with cover sheet).
"Embracing the quantum limit in silicon computing," Morton et al, Macmillan Publishers, Nov. 17, 2011, vol. 479, Nature, pp. 345-353.
"Review : Towards Spintronic Quantum Technologies with Dopants in Silicon," Morley, Gavin, Department of Physics, University of Warwich, 13 pages.
"A Reconfigurable Gate Architecture for Si/SiGe Quantum Dots," Zajac et al., Department of Physics, Princeton University; Department of Physics, University of California; Feb. 6, 2015, 5 pages.
"Scalable quantum circuit and control for a superconducting surface code," Versluis et al, Netherlands Organisation for Applied Scientific Research, Dec. 28, 2016, 9 pages.
"Defect reduction of selective Ge epitaxy in trenches on Si(001) substrates using aspect ratio trapping," Park et al., Applied Physics Letter 90, 052113 (2007), pp. 052113-1 through 3.
"Photon- and phonon-assisted tunneling in the three-dimensional charge stability diagram of a triple quantum dot array," Braakman et al., Applied Physics Letters 102, 112110 (2013), pp. 112110-1 through 4 (5 pages with cover sheet).
"Silicon CMOS architecture for a spin-based quantum computer," Veldhorst et al., Qutech, TU Delft, the Netherlands, Centre for Quantum Computation and Communication Technology, School of Electrical Engineering and Telecommunications, The University of New South Wales, NanoElectronics Group, MESA + Institute for Nanotechnology, University of Twente, the Netherlands, Oct. 2, 2016, 13 pages.
"Single-electron Transistors fabricated with sidewall spacer patterning," Park et al., Superlattices and Microstructures 34 (2003) 231-239.
"Single-electron Transistors with wide operating temperature range," Dubuc et al., Applied Physics Letters 90, 113104 (2007) pp. 113104-1 through 3.
"Single-shot read-out of an individual electron spin in a quantum dot," Elzerman et al., Nature, vol. 430, Jul. 22, 2004, pp. 431-435.
"Suspending superconducting qubits by silicon micromachining," Chu et al., Department of Applied Physics, Yale University, Jun. 10, 2016, 10 pages.
"Single-charge tunneling in ambipolar silicon quantum dots," Müller, Filipp, Dissertation, University of Twente, Jun. 19, 2015, 148 pages.
"An addressable quantum dot qubit with fault-tolerant control-fidelity," Veldhorst et al., Nature Nanotechnology vol. 9, Dec. 2014, pp. 981-985.

* cited by examiner

QUANTUM COMPUTING ASSEMBLIES WITH THROUGH-HOLE DIES

BACKGROUND

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1A:
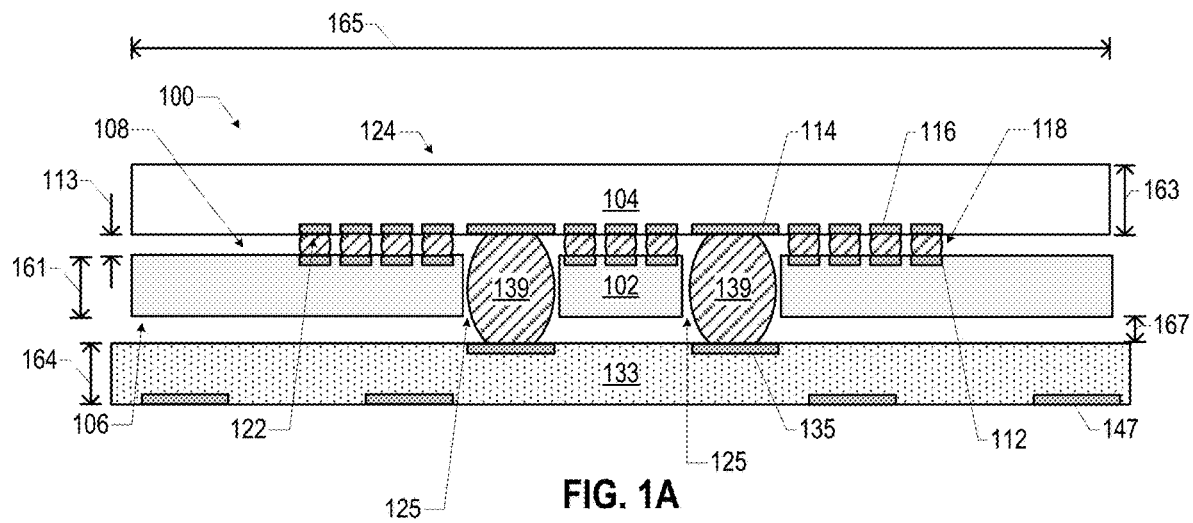
FIGS. 1A-1B are views of an example quantum computing assembly, in accordance with various embodiments.

Quantum computing assemblies with through-hole dies, and related devices and methods, are disclosed herein. For example, in some embodiments, a quantum computing assembly may include a package substrate, a quantum processing die, and a through-hole die between the package substrate and the quantum processing die, wherein the quantum processing die is electrically coupled to the package substrate by interconnects extending through through-holes of the through-hole die.

Communicating large numbers of signals between two or more dies in a multi-die electronics package is challenging due to the increasingly small size of such dies, thermal constraints, and power delivery constraints, among others. Conventional package technologies may not be adequate for quantum computing applications, which often involve extreme operational environments (e.g., vacuum, very low temperatures, etc.) and extra sensitivity to electrical losses (e.g., the losses caused by organic materials around interconnects in conventional packages). Further, as the number of qubits or other quantum computing circuitry in a die increases, the die size may increase, potentially resulting in greater mechanical stresses on the interface between the die and other components (e.g., between the die and a package substrate, or between the die and other dies), lower yield, and/or limitations on reticle size.

Various ones of the embodiments disclosed herein may help achieve good mechanical reliability with reduced impacts on qubit performance relative to previous approaches. For example, various ones of the embodiments disclosed herein may achieve a smaller footprint and less undesirable coupling than some previous wirebond techniques (which have previously required large footprints with complex designs to route the signals to the edges of the dies) or some previous flip chip techniques (which have not permitted the use of underfill due to undesirable effects, and which otherwise have not been able to achieve a desired fine pitch).

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The terms "top" and "bottom" may be used herein to explain various features of the drawings, but these terms are simply for ease of discussion, and do not imply a desired or required orientation. As used herein, the term "insulating" means "electrically insulating," unless otherwise specified.

When used to describe a range of dimensions, the phrase "between X and Y" represents a range that includes X and Y. For convenience, the phrase "FIG. 1" may be used to refer to the collection of drawings of FIGS. 1A-1B, the phrase "FIG. 6" may be used to refer to the collection of drawings of FIGS. 6A-6B, etc. Although certain elements may be referred to in the singular herein, such elements may include multiple sub-elements. For example, "an insulating material" may include one or more insulating materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via).

Figure 1B:
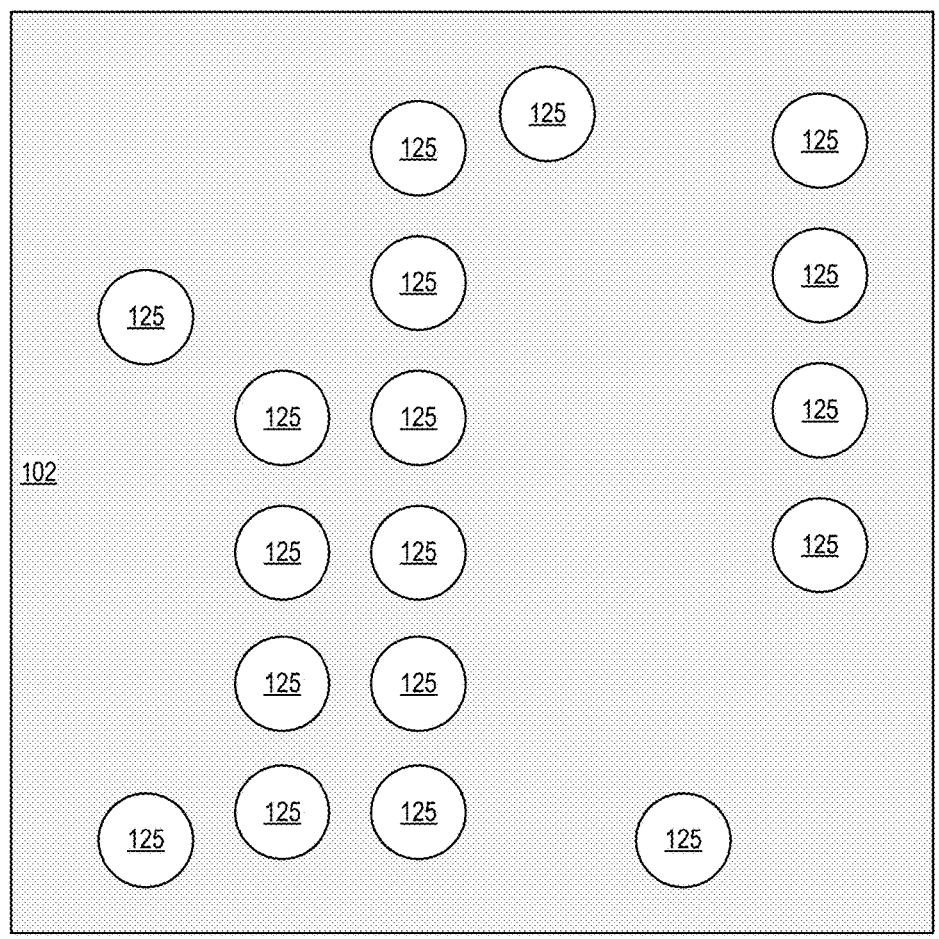

FIG. 1 presents various views of a quantum computing assembly 100, in accordance with various embodiments. In particular, FIG. 1A is a side, cross-sectional view, while FIG. 1B is a top view of the through-hole die 102, showing an example arrangement of through-holes 125. Although particular numbers and arrangements of elements (e.g., through-holes 125, conductive contacts 116, 112, 114, 135, and 147, etc.) are shown in FIG. 1 (and others of the accompanying figures), these are simply illustrative, and any number and arrangement may be used. A number of elements are illustrated in FIG. 1 (and other figures) as included in the quantum computing assembly 100, but a number of these elements may not be present in a quantum computing assembly 100. For example, in various embodiments, the package substrate 133 may not be included. Further, a number of elements not illustrated in FIG. 1 (or other figures) may be included in a quantum computing assembly 100. For example, in various embodiments, a quantum computing assembly 100 may include second-level interconnects (SLI, not shown) coupled between the conductive contacts 147 of the package substrate 133 and a circuit board (not shown). Other components that may be included in a quantum computing assembly 100 include additional passive components, such as surface-mount resistors, capacitors, and/or inductors (e.g., disposed on the top surface 108 or the bottom surface 106 of the through-hole die 102, or embedded in the through-hole die 102). In another example, a quantum computing assembly 100 may include a thermal interface material (TIM) and a heat spreader.

Many of the elements of the quantum computing assembly 100 of FIG. 1 are included in other ones of the accompanying figures; the discussion of these elements is not repeated when discussing these figures, and any of these elements may take any of the forms disclosed herein. In some embodiments, individual ones of the quantum computing assemblies 100 disclosed herein may serve as a system-in-package (SiP). In such embodiments, the quantum computing assembly 100 may be referred to as an SiP.

The quantum computing assembly 100 of FIG. 1 includes a package substrate 133, a quantum processing die 104, and a through-hole die 102 between the package substrate 133 and the quantum processing die 104. Conductive contacts 116 at the bottom surface 122 of the quantum processing die 104 may be coupled to conductive contacts 112 at the top surface 108 of the through-hole die 102 by first-level interconnects (FLI) 118 (e.g., solder). Further, the through-hole die 102 may include one or more through-holes 125, through which FLI 139 (e.g., solder) between the quantum processing die 104 and the package substrate 133 may extend. In other words, one or more FLI 139 may contact conductive contacts 135 at the top surface of the package substrate 133 and conductive contacts 114 at the bottom surface 122 of the quantum processing die 104, and these FLI 139 may extend through a through-hole 125. In some embodiments, a single FLI 139 may extend through a single through-hole 125, or multiple FLI 139 may extend through a single through-hole 125 (e.g., as discussed below with reference to FIG. 5). In the embodiment of FIG. 1, no FLI directly couple the through-hole die 102 to the package substrate 133; other embodiments including such additional FLI are discussed below with reference to FIG. 2.

Including a through-hole die 102 in a quantum computing assembly 100 may achieve any of a number of advantages relative to conventional packaging approaches. The through-holes 125 in the through-hole die 102 enable direct electrical connections to be made between the quantum processing die 104 and the package substrate 133 (reducing cross-talk, reflections and/or loss relative to embodiments in which electrical connections between the quantum processing die 104 and the package substrate 133 route through another intermediate medium (e.g., through silicon vias (TSVs) in an intermediate silicon unit), while also providing good isolation between the quantum processing die 104 and the package substrate 133 (relative to variants in which the quantum processing die 104 and the package substrate 133 are adjacent, and the performance of the qubit elements of the quantum processing die 104 is negatively impacted by the proximity of the materials of the package substrate 133). In some embodiments, the through-hole die 102 may serve as a ground plane for operation of the quantum processing die 104, providing good grounding of the quantum processing die 104 and thus enhanced performance. Additional variants, and their relative advantages, are discussed further below.

The quantum processing dies 104 included in any of the quantum computing assemblies 100 disclosed herein may perform quantum processing operations. Other dies (not shown) included in a quantum computing assembly may include a control die (e.g., coupled to the package substrate 133, or coupled to a same circuit board as the package substrate 133). A control die may include one or more non-quantum circuits for controlling the operation of one or more quantum processing dies 104 (discussed below). In some embodiments, a control die may provide peripheral logic to support the operation of one or more quantum processing dies 104. For example, a control die may control the performance of a read operation, control the performance of a write operation, control the clearing of quantum bits, etc. The control that the control die may exercise over the operation of a quantum processing die 104 may depend on the type of qubits implemented by the quantum processing die 104. For example, if the quantum processing die 104 implements superconducting qubits (discussed below with reference to FIGS. 11-13), the control die may provide and/or detect appropriate electrical signals in any of the flux bias lines, microwave lines, and/or drive lines to initialize and manipulate the superconducting dots. In another example, if the quantum processing die 104 implements spin qubits (discussed below with reference to FIGS. 14-15), the control die may provide and/or detect appropriate electrical signals in any of the gates 706/708, the quantum well layer 752, the magnet lines 721, etc.

A control die may also perform conventional computing functions to supplement the computing functions that may be provided by one or more quantum processing dies 104. For example, a control die may interface with one or more of the other components of a quantum computing device, such as the quantum computing device discussed below with reference to FIG. 17, in a conventional manner, and may serve as an interface between one or more quantum processing dies 104 and conventional components. In some embodiments, one or more control dies may be implemented in or may be used to implement the non-quantum processing device 2028 described below with reference to FIG. 17. In some embodiments, one or more control dies may include radio frequency (RF) devices, memory, amplifiers, power management devices, antennas, arrays, sensors, microelectromechanical systems (MEMS) devices, mixers, multiplexers, filters, analog-to-digital converters, digital-to-analog converters, and/or analog-to-digital converters, for example. Any of the components described herein as being included in a control die may be included in a through-hole die 102 (e.g., in the patterned region 143 of a through-hole die 102, as discussed below with reference to FIG. 4).

As noted above, the quantum computing assembly 100 may include one or more through-hole dies 102 coupled to one or more quantum processing dies 104 by FLI 118. For example, as illustrated in FIG. 1, the top surface 108 of the through-hole die 102 may include a set of conductive contacts 112, and the bottom surface 122 of the quantum processing die 104 may include a set of conductive contacts 116; the conductive contacts 116 at the bottom surface 122 of the quantum processing die 104 may be electrically and mechanically coupled to the conductive contacts 112 at the top surface 108 of the through-hole die 102 by the FLI 118. Any of the conductive contacts disclosed herein (e.g., the conductive contacts 110, 112, 114, 116, 135, and/or 137) may include bond pads, posts, or any other suitable conductive contact, for example. The quantum processing die 104, the through-hole die 102, and the package substrate 133 (as well as the interconnections between these elements) may provide a quantum computing package. In some embodiments, a distance 113 between the top surface 108 of the through-hole die 102 and the bottom surface 122 of the quantum processing die 104 may be between 2 microns and 100 microns. In some embodiments, a distance 167 between the top surface of the package substrate 133 and the bottom surface 106 of the through-hole die 102 may be between 20 microns and 500 microns.

The package substrate 133 may include an insulating material (e.g., a dielectric material formed in multiple layers, as known in the art) and one or more conductive pathways through the dielectric material (e.g., including conductive traces and/or conductive vias, not shown). In some embodiments, the insulating material of the package substrate 133 may be a dielectric material, such as an organic dielectric material, a fire-retardant grade 4 material (FR-4), bismaleimide triazine (BT) resin, polyimide materials, glass reinforced epoxy matrix materials, an inorganic dielectric material such as silicon or glass (e.g., the package substrate 133 may be a silicon or glass interposer), or a low-k or ultra low-k dielectric (e.g., carbon-doped dielectrics, fluorine-doped dielectrics, porous dielectrics, and organic polymeric dielectrics). In particular, when the package substrate 133 is formed using standard printed circuit board (PCB) processes, the package substrate 133 may include FR-4, and the conductive pathways in the package substrate 133 may be formed by patterned sheets of copper separated by build-up layers of the FR-4. The conductive pathways in the package substrate 133 may be bordered by liner materials, such as adhesion liners and/or barrier liners, as suitable.

In some embodiments, the package substrate 133 may have a core (not shown) formed of a stiff material to impart additional mechanical stiffness to the quantum computing assembly 100. This additional stiffness may aid in mitigating warpage of the quantum computing assembly 100 (e.g., when the quantum computing assembly 100 is subjected to extremely low temperatures). In some embodiments, this core may include ceramic or glass.

The quantum processing die 104 disclosed herein may include an insulating material (e.g., a dielectric material formed in multiple layers, as known in the art) and multiple conductive pathways formed through the insulating material. In some embodiments, the insulating material of a quantum processing die 104 may include a dielectric material, such as silicon dioxide, silicon nitride, oxynitride, polyimide materials, glass reinforced epoxy matrix materials, or a low-k or ultra low-k dielectric (e.g., carbon-doped dielectrics, fluorine-doped dielectrics, porous dielectrics, organic polymeric dielectrics, photo-imageable dielectrics, and/or benzocyclobutene-based polymers). In some embodiments, the insulating material of a quantum processing die 104 may include a semiconductor material, such as silicon, germanium, or a III-V material (e.g., gallium nitride), and one or more additional materials. For example, an insulating material may include silicon oxide or silicon nitride. The conductive pathways in a quantum processing die 104 may include conductive traces and/or conductive vias, and may connect any of the conductive contacts in the quantum processing die 104 in any suitable manner (e.g., connecting multiple conductive contacts on a same surface or on different surfaces of the quantum processing die 104). The conductive pathways in the quantum processing die 104 may be bordered by liner materials, such as adhesion liners and/or barrier liners, as suitable. In some embodiments, a quantum processing die 104 may include conductive pathways to route power, ground, and/or signals to/from the through-hole die 102 and the package substrate 133 included in the quantum computing assembly 100. The qubit elements (e.g., superconducting qubit elements and/or spin qubit elements) included in the quantum processing die 104 may be located in a device region closer to the bottom surface 122 (and the conductive contacts 114/116) than to the top face 124.

In some embodiments, the through-hole die 102 may be a substantially uniform block of material (e.g., a semiconductor material, a superconducting material, a crystalline material such as quartz, etc.), and may not include any conductive pathways or active or passive circuitry. In some embodiments, the through-hole die 102 may include conductive pathways (e.g., including vias 145 as discussed below with reference to FIG. 2, and/or in a patterned region 143 as discussed below with reference to FIG. 4), and may not contain active or passive circuitry. In some embodiments, the through-hole die 102 may include active or passive circuitry (e.g., transistors, diodes, resistors, inductors, and capacitors, among others) (e.g., in a patterned region 143 as discussed below with reference to FIG. 4). In some embodiments, the through-hole die 102 may include qubit elements (e.g., allowing the through-hole die 102 to perform quantum processing operation on its own or in conjunction with the quantum processing die 104) (e.g., in a patterned region 143 as discussed below with reference to FIG. 4).

The conductive pathways disclosed herein (e.g., conductive traces and/or conductive vias) may be formed of any appropriate conductive material, such as copper, silver, nickel, gold, aluminum, or other metals or alloys, for example. In some embodiments, the conductive pathways may include superconductor materials (i.e., the metallization in the quantum processing die 104 and the metallization in the through-hole die 102, if any, may include a superconductor). In some embodiments, some or all of the electrically conductive elements in the quantum computing assemblies 100 disclosed herein may include superconducting materials. Example superconducting materials may include elemental superconductors such as aluminum, niobium, indium, tin, titanium, osmium, zinc, molybdenum, tantalum, or vanadium, or compound superconductors such as niobium titanium, niobium aluminum, or niobium tin, titanium nitride, or niobium titanium nitride.

The FLI disclosed herein (e.g., the FLI 139, 118, and 137 discussed herein) may take any suitable form. In some embodiments, a set of FLI may include solder (e.g., solder bumps or balls that are subject to a thermal reflow to form the FLI). FLI that include solder may include any appropriate solder material, such as a solder that includes a superconductor (e.g., an indium-based solder). Using a cryogenically compliant solder, like an indium-based solder, for the FLI may reduce the risk of mechanical failure (relative to non-cryogenically compliant solders) due to the differential thermal expansion of the components of the quantum computing assembly 100 (e.g., the package substrate 133, the through-hole die 102, and the quantum processing die 104).

In some embodiments, the quantum processing die 104 and the through-hole die 102 may be built on different material systems. For example, in some embodiments, a through-hole die 102 in a quantum computing assembly 100 may include a silicon or germanium die substrate, and a quantum processing die 104 in the quantum computing assembly 100 may include a III-V material die substrate (or vice versa). In another example, a through-hole die 102 may include a sapphire substrate, and a quantum processing die 104 may include a semiconductor substrate (or vice versa). As noted below, in some embodiments, the dies 102/104 may be tested before they are assembled into the quantum computing assembly 100 so that only dies 102/104 exhibiting adequate performance are assembled, improving the yield for the quantum computing assemblies 100.

As noted above, the quantum computing assembly 100 of FIG. 1 may also include a circuit board (not shown). The package substrate 133 may be coupled to the circuit board by SLI (not shown) in contact with the conductive contacts 147 at the bottom surface of the package substrate 133. The SLI may include solder balls (e.g., for a ball grid array arrangement), pins (e.g., in a pin grid array arrangement), or lands (e.g., in a land grid array arrangement), for example. The circuit board may be a motherboard, for example, and may have other components attached to it. The circuit board may include conductive pathways and other conductive contacts for routing power, ground, and signals through the circuit board, as known in the art. In some embodiments, the SLI may not couple the package substrate 133 to a circuit board, but may instead couple the package substrate 133 to another package, an interposer, or any other suitable component.

Figure 7:
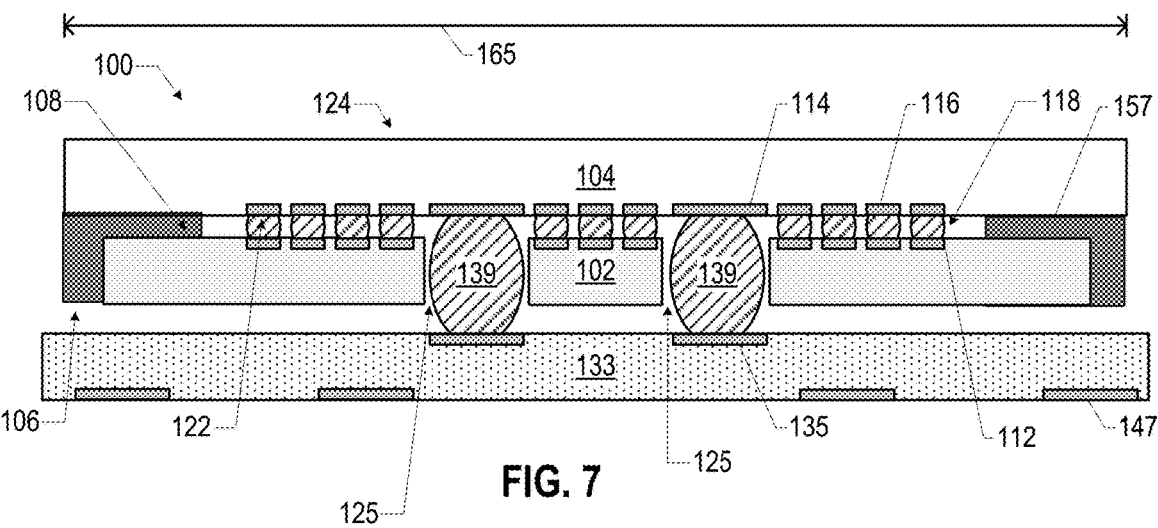
FIG. 7 is a side, cross-sectional view of an example quantum computing assembly, in accordance with various embodiments.

The elements of the quantum computing assembly 100 may have any suitable dimensions. Only a subset of the accompanying figures are labeled with reference numerals representing dimensions, but this is simply for clarity of illustration, and any of the quantum computing assemblies 100 disclosed herein may have components having the dimensions discussed herein. For example, in some embodiments, the thickness 164 of the package substrate 133 may be between 0.1 millimeters and 2.4 millimeters (e.g., between 0.1 millimeters and 0.35 millimeters, between 0.25 millimeters and 1.4 millimeters, or approximately 1 millimeter). In some embodiments, the thickness 161 of the through-hole die 102 may be between 10 microns and 200 microns. In some embodiments, the thickness 163 of the quantum processing die 104 may be between 200 microns and 700 microns. In some embodiments, a lateral dimension 165 of the through-hole die 102 may be between 5 millimeters and 60 millimeters. An analogous lateral dimension of the quantum processing die 104 may be greater than, equal to, or less than the lateral dimension 165. For example, as shown in FIG. 7, the lateral dimension 165 of the through-hole die 102 may be less than the analogous lateral dimension of the quantum processing die 104.

Figure 2:
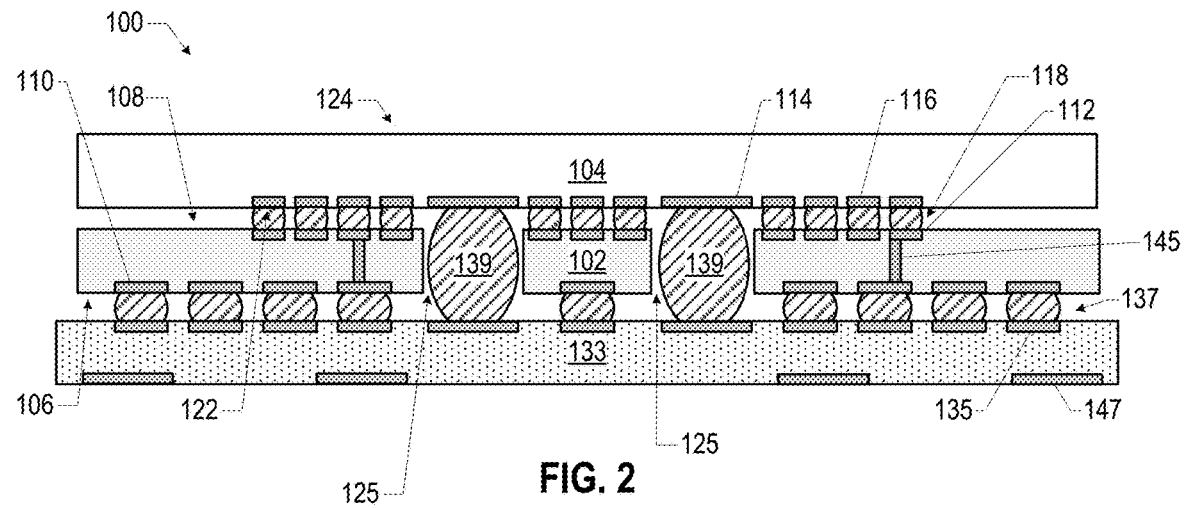
FIGS. 2-4 are side, cross-sectional views of example quantum computing assemblies, in accordance with various embodiments.
Figure 3:
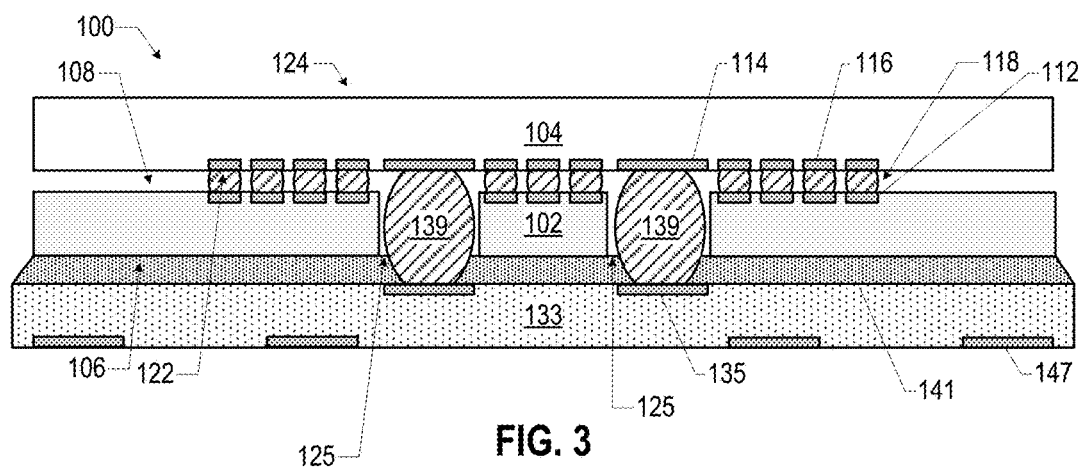

FIGS. 2-7 illustrate additional example quantum computing assemblies 100. Any of the features discussed with reference to any of FIGS. 1-7 herein may be combined with any other features to form a quantum computing assembly 100. For example, as discussed further below, FIG. 2 illustrates an embodiment in which the through-hole die 102 includes FLI 137 between the bottom surface 106 of the through-hole die 102 and the top surface of the package substrate 133, and FIG. 3 illustrates an embodiment in which an underfill material 141 is between the through-hole die 102 and the package substrate 133. These features of FIGS. 2 and 3 may be combined so that a quantum computing assembly 100, in accordance with the present disclosure, includes FLI 137 between the bottom surface 106 of the through-hole die 102 and the top surface of the package substrate 133, and an underfill material 141 is present between the through-hole die 102 and the package substrate 133. This particular combination is simply an example, and any combination may be used. A number of elements of FIG. 1 are shared with FIGS. 2-7; for ease of discussion, a description of these elements is not repeated, and these elements may take the form of any of the embodiments disclosed herein.

As noted above, in some embodiments, a through-hole die 102 may include conductive pathways through the through-hole die 102. For example, a through-hole die 102 may include conductive pathways (including, e.g., conductive lines and/or conductive vias) between the bottom surface 106 and the top surface 108, and conductive contacts at both the bottom surface 106 and the top surface 108 (i.e., the conductive contacts 110 and 112, respectively). FIG. 2 illustrates a particular embodiment in which a through-hole die 102 includes vias 145 extending between the bottom surface 106 and the top surface 108. Such vias 145 may contact conductive contacts 112 at the top surface 108 and conductive contacts 110 at the bottom surface 106 of the through-hole die 102, and FLI 137 may conductively couple the conductive contacts 110 of the through-hole die 102 and conductive contacts 135 of the package substrate 133. The vias 145 may thus be part of a substantially "straight" conductive pathway between associated conductive contacts 116 of the quantum processing die 104 and conductive contacts 135 of the package substrate 133. In other words, the vias 145 may be part of a conductive pathway between the quantum processing die 104 (e.g., between qubit elements located proximate to the bottom surface 122 of the quantum processing die 104) and the package substrate 133 that is different from the pathway through the FLI 139. In embodiments in which the through-hole die 102 is a semiconductor material, the vias 145 may be through-semiconductor vias (e.g., through-silicon vias when the through-hole die 102 is formed from a silicon wafer). In some embodiments, the vias 145 may be used for low current pathways (e.g., ground pathways). In other embodiments, no vias 145 may be present in the through-hole die 102 as part of conductive pathways that electrically couple the bottom surface 106 and the top surface 108.

In some embodiments, an underfill material may be present between the through-hole die 102 and the package substrate 133. For example, FIG. 3 illustrates a quantum computing assembly 100 in which an underfill material 141 is present between the through-hole die 102 and the package substrate 133. The underfill material 141 may impart additional mechanical rigidity and reliability to the quantum computing assembly 100, particularly at cryogenic temperatures. In the absence of the through-hole die 102, simply filling the volume between the quantum processing die 104 and the package substrate 133 with an underfill material 141 may unacceptably compromise the performance of the quantum processing die 104 (e.g., with poor performance arising from interactions between the lossy underfill material 141 and the qubit elements in the quantum processing die 104). However, the presence of the through-hole die 102 as a "barrier" between the underfill material 141 and the quantum processing die 104 may mitigate these lossy interactions, allowing the mechanical advantages of the underfill material 141 to be realized without unacceptable performance reductions. The underfill material 141 may be an insulating material, such as an appropriate epoxy material. The underfill material 141 may be selected to have a coefficient of thermal expansion (CTE) that may mitigate or minimize the stress between the dies 102/104 and the package substrate 133 arising from uneven thermal expansion in the quantum computing assembly 100. In some embodiments, the CTE of the underfill material 141 may have a value that is intermediate to the CTE of the through-hole die 102 and a CTE of the package substrate 133. The underfill material 141 may be selected based on the adhesion strength to the different adjacent materials and/or its mechanical properties at cryogenic temperatures (e.g., to avoid cracking or delamination during cooldown or at low temperature). The underfill material 141 may be pre-applied to the die 102 or package substrate 133, or may be applied after attaching the die 103 to the package substrate 133 (e.g., through capillary action). The first-level interconnects 139 (through the through-holes 125) and the first-level interconnects 118 (between the die 102 and the die 104) may be designed such that the underfill material 141 (e.g., a capillary underfill material) does not contaminate the areas where the qubit elements or located and/or the areas that include circuitry that require very low loss, such as resonators or other types of qubit coupling structures. The designs may include fully sealed first-level interconnects 139 (e.g., a ring-shaped, solder-based seal material 149 around each through hole 125, as discussed elsewhere herein) or sufficient gap between the first-level interconnects 139 and the through-hole die 102 such that capillary force does not cause the underfill material 141 to rise up and fill the gap between the through-hole die 102 and the qubit die 104.

Figure 4:
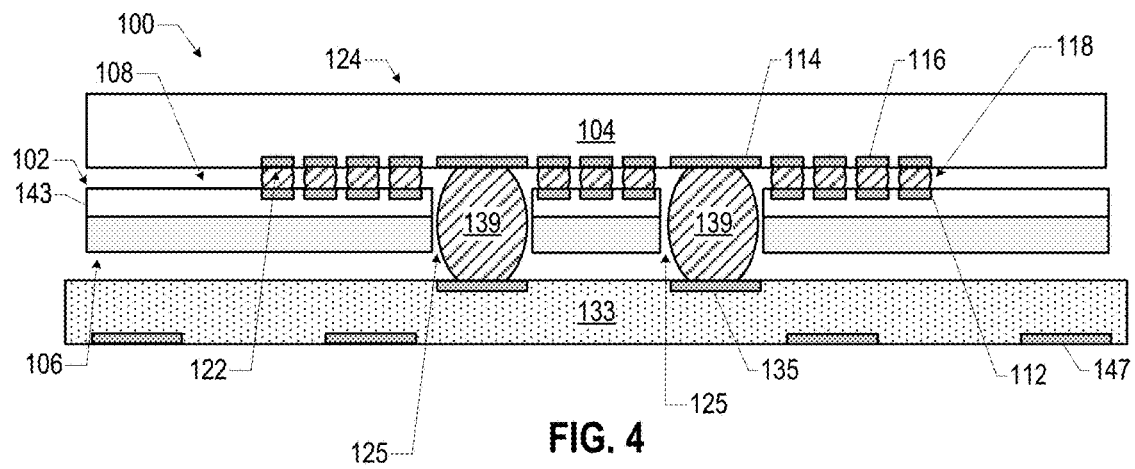

As noted above, in some embodiments, the through-hole die 102 may include conductive lines, conductive vias, and/or other circuitry (e.g., control circuitry and/or quantum processing circuitry, as discussed above). This circuitry may be included in a patterned region within the through-hole die 102. For example, FIG. 4 illustrates a quantum computing assembly 100 in which the through-hole die 102 includes a patterned region 143 proximate to the top surface 108 of the through-hole die 102. Including such circuitry at the surface of the through-hole die 102 that is closest to the quantum processing die 104 may minimize losses and/or latency, but in other embodiments, the patterned region 143 may be disposed proximate to the bottom surface 106 of the through-hole die 102 instead. In some embodiments, the quantum processing die 104 may include superconducting-type qubits and coplanar waveguides, and the patterned region 143 of the through-hole die 102 may include a patterned superconducting surface that allows shorting the ground on both sides of the coplanar waveguides and resonators of the quantum processing die 104. In some embodiments, the quantum processing die 104 may include superconducting-type qubits with transmission lines and resonators, and the patterned region 143 of the through-hole die 102 may include cross-over transitions between different transmission lines and/or between transmission lines and resonators. In some embodiments, the patterned region 143 of the through-hole die 102 may include active devices (e.g., Josephson junctions or parametric amplifiers when the quantum processing die 104 includes superconducting-type qubits). Such active devices may, for example, help condition the signals into and/or out of the quantum processing die 104. In some embodiments, the patterned region 143 of the through-hole die 102 may include qubit elements (e.g., superconducting-type or spin-type qubit elements) to potentially reduce the footprint of the quantum processing die 104. In some embodiments, the through-hole die 102 may not include any patterned region 143 (and may instead be a substantially uniform material with conductive contacts 110 and/or 112 thereon). For example, in some embodiments in which the quantum processing die 104 includes superconducting-type qubits, the through-hole die 102 may provide a solid superconducting surface proximate to the resonators and qubit elements to help isolate them from the surrounding environment (e.g., mitigating the impact of lossy materials used elsewhere in the quantum computing assembly 100 on qubit performance).

Figure 5:
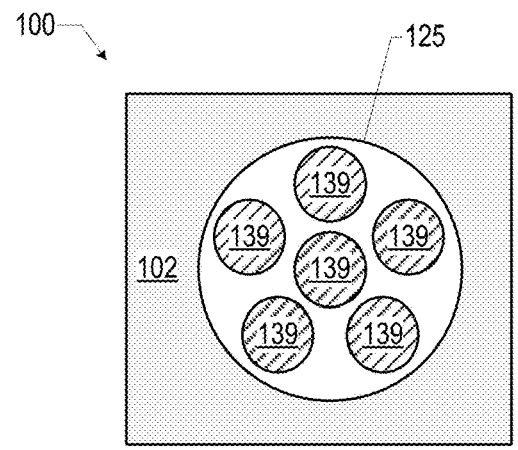
FIG. 5 is a top, cross-sectional view of an example arrangement of interconnects between a quantum processing die and a package substrate.

As noted above, in some embodiments, one or more FLI 139 may extend through a single through-hole 125 in a through-hole die 102. FIG. 5 is a top, cross-sectional view of a portion of a quantum computing assembly 100, illustrating multiple FLI 139 extending through a single through-hole 125. In FIG. 5, the FLI 139 are arranged as a single central FLI 139, with multiple (e.g., five) FLI 139 distributed around the central FLI 139. Such an arrangement may be appropriate in a RF connection; the central FLI 139 may serve as part of a signal pathway, while the peripheral FLI 139 may provide grounds for shielding. Other arrangements of multiple FLI 139 through a single through-hole 125 in a through-hole die 102 may be used, as desired.

Figure 6A:
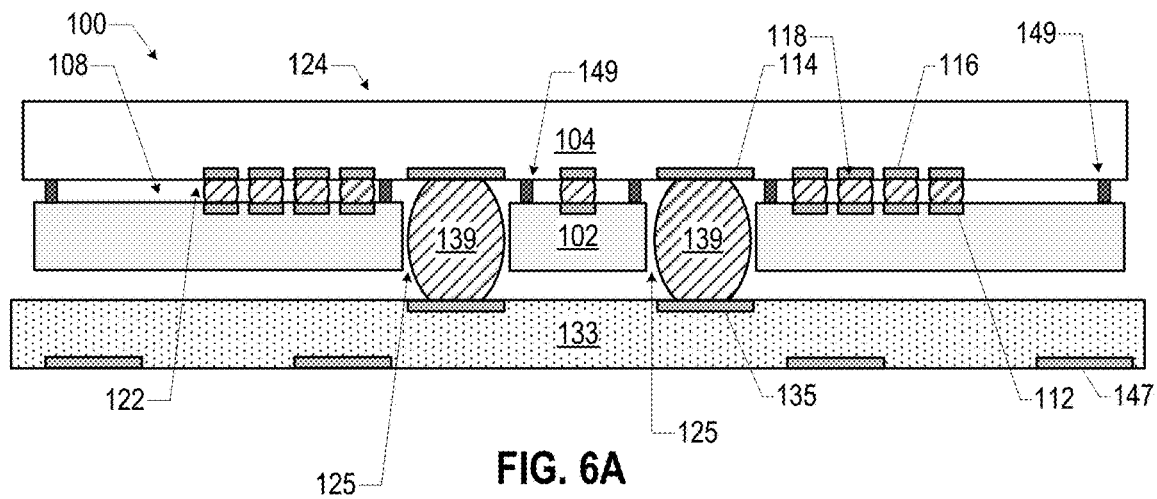
FIGS. 6A-6B are views of an example quantum computing assembly, in accordance with various embodiments.
Figure 6B:
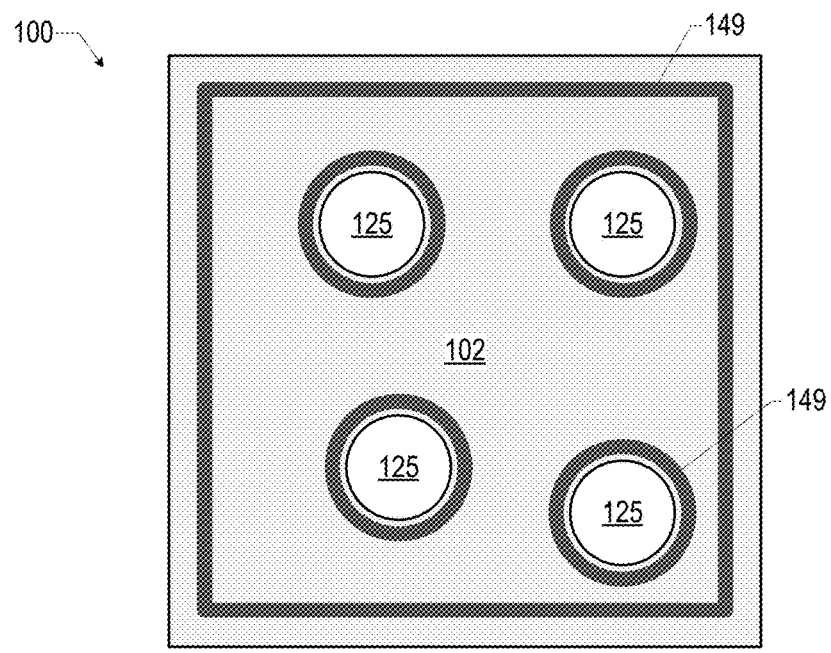

In some embodiments, the volume between the through-hole die 102 and the quantum processing die 104 may be largely sealed off from the surrounding environment in order to maintain a desired set of environmental conditions between the through-hole die 102 and the quantum processing die 104 and/or to protect the top surface 108 of the through-hole die 102 and/or the bottom surface 122 of the quantum processing die 104 from damage. For example, FIG. 6 illustrates a quantum computing assembly 100 including seal material 149 around the through-holes 125, as well as proximate to the perimeter of the through-hole die 102; FIG. 6A is a side, cross-sectional view, while FIG. 6B is a top view of the through-hole die 102, illustrating the through-holes 125 and the seal material 149. The seal material 149 may help isolate the volume around the FLI 118, including the proximate surfaces 122 and 108, from the environment around the quantum computing assembly 100. In some embodiments, the seal material 149 may provide a hermetic seal. Use of the seal material 149 may enable aggressive cleaning operations to be performed around the quantum computing assembly 100 without impacting the sensitive qubit elements located proximate to the bottom surface 122 and/or the top surface 108. Further, if the through-hole die 102 is attached to the quantum processing die 104 in a vacuum environment or in an inert gas environment (e.g., nitrogen, argon, etc.), maintaining the vacuum/inert gas conditions in the sealed volume between the through-hole die 102 and the quantum processing die 104 may stop or slow the degradation of the conductive contacts 116/112, and/or the qubit elements proximate to the surfaces 122/108, due to typical environmental conditions (e.g., oxidation, interactions with other gases and/or liquids during assembly, etc.). Any suitable conductive or non-conductive material may be used for the seal material 149. In some embodiments, the seal material 149 may be solder.

In some embodiments, a mold material may be used proximate to the periphery of the through-hole die 102 to impart additional mechanical reliability to the quantum computing assembly 100 without substantially compromising performance due to undesirable interaction between the qubit elements and the lossy mold material. For example, FIG. 7 is a side, cross-sectional view of a quantum computing assembly 100 including mold material 157 on side faces of the through-hole die 102 and between the through-hole die 102 and the quantum processing die 104, proximate to the periphery of the through-hole die 102 and the quantum processing die 104. Limiting mold material 157 to regions proximate to the periphery of the through-hole die 102 and the quantum processing die 104 may minimize the negative impact such material may have on the performance of qubit elements in the quantum processing die 104 and/or the through-hole die 102. The mold material 157 may include any suitable material (e.g., any of the materials discussed above with reference to the underfill material 141). An example manufacturing process that may result in a quantum computing assembly 100 like the one illustrated in FIG. 7 is discussed below with reference to FIG. 10.

Any suitable techniques may be used to manufacture the quantum computing assemblies disclosed herein. For example, FIGS. 8A-8H are side, cross-sectional views of various stages in an example process for manufacturing the quantum computing assembly 100 of FIG. 1, in accordance with various embodiments. Although the operations discussed below with reference to FIG. 8 (and others of the accompanying drawings representing manufacturing processes, such as FIGS. 9 and 10) are illustrated in a particular order, these operations may be performed in any suitable order. Additionally, although particular assemblies are illustrated in FIG. 8 (and others of the accompanying drawings representing manufacturing processes, such as FIGS. 9 and 10), the operations discussed below with reference to FIG. 8 may be used to form any suitable assemblies.

Figure 8A:
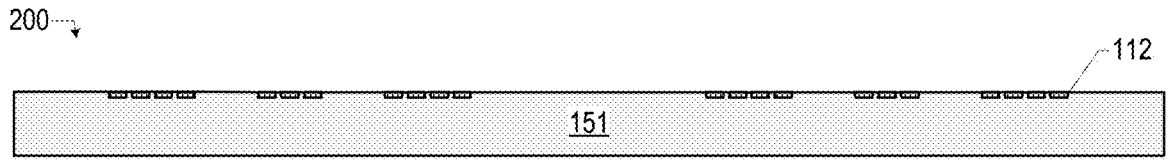
FIGS. 8A-8H are side, cross-sectional views of various stages in an example process for manufacturing an example quantum computing assembly, in accordance with various embodiments.

FIG. 8A illustrates an assembly 200 including a wafer 151 having conductive contacts 112 formed thereon. Later in the manufacturing process, the wafer 151 will be singulated to form multiple units of the through-hole die 102, and thus the conductive contacts 112 in the assembly 200 represent repeating units of the conductive contacts 112 of the through-hole die 102. In embodiments in which the through-hole die 102 include a patterned region 143, the wafer 151 will also include repeating units of the patterned region 143 (formed using any suitable manufacturing techniques, such as lithographic techniques, and not shown for ease of illustration). In embodiments in in which the through-hole die 102 includes TSVs, the wafer 151 will also include TSVs.

Figure 8B:
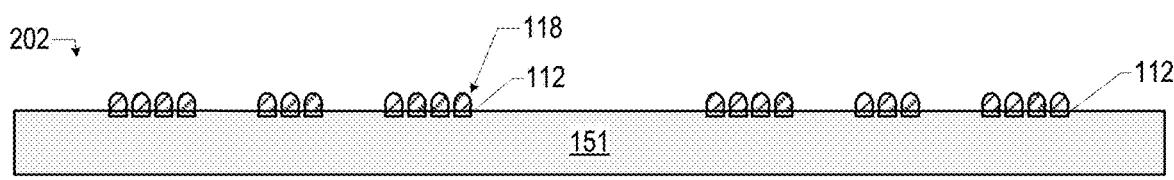

FIG. 8B illustrates an assembly 202 subsequent to forming FLI 118 (e.g., solder) on the conductive contacts 112 of the assembly 200 (FIG. 8A). In some embodiments in which the FLI 118 include solder, the FLI 118 may be formed by plating.

Figure 8C:
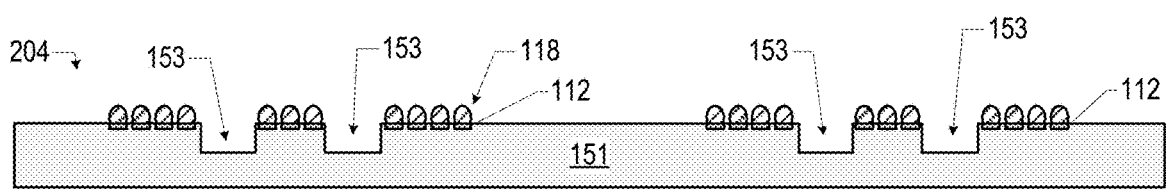

FIG. 8C illustrates an assembly 204 subsequent to forming recesses 153 in the top surface of the wafer 151 of the assembly 202 (FIG. 8B). The recesses 153 may be formed by any suitable process (e.g., a timed etch, reactive ion etching, etc.), and may be located where through-holes 125 are to be located in the through-hole dies 102, as discussed further below. The depth of the recesses 153 may be greater than or equal to the desired thickness 161 of the through-hole dies 102.

Figure 8D:
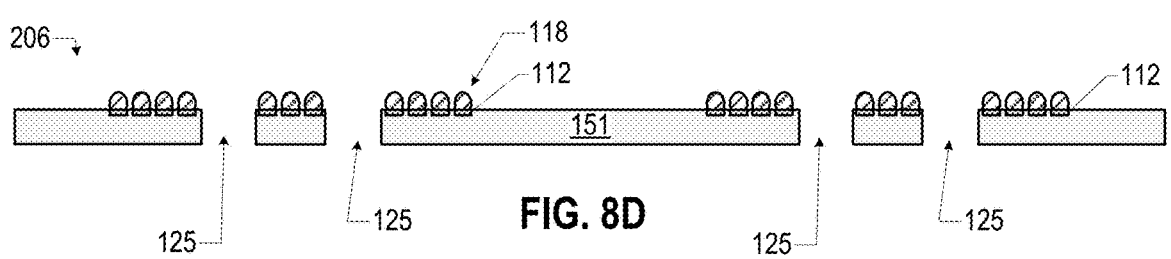

FIG. 8D illustrates an assembly 206 subsequent to grinding the bottom surface of the wafer 151 in the assembly 204 (FIG. 8C). The grinding operation may "thin" the wafer 151 until the recesses 153 of the assembly 204 become the through-holes 125, as shown. The FLI 118 may be protected by a temporary layer (not shown) during this operation (e.g., by depositing and curing a photoresist, grinding, then stripping the photoresist).

Figure 8E:
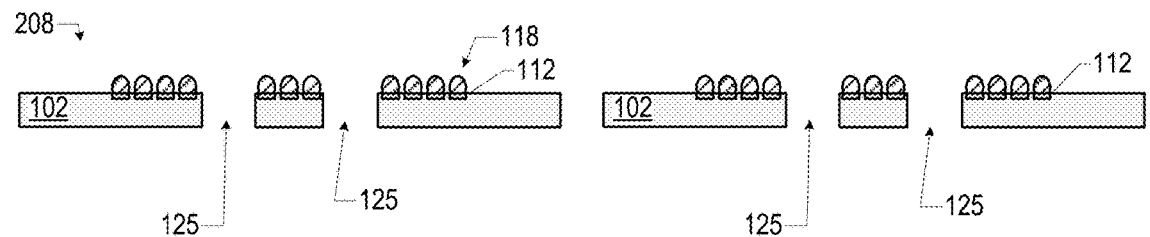

FIG. 8E illustrates an assembly 208 subsequent to singulating the wafer 151 of the assembly 206 (FIG. 8D) to separate different ones of the through-hole dies 102 from each other, as shown. In some embodiments, a diamond saw or laser may be used to perform this singulation.

Figure 8F:
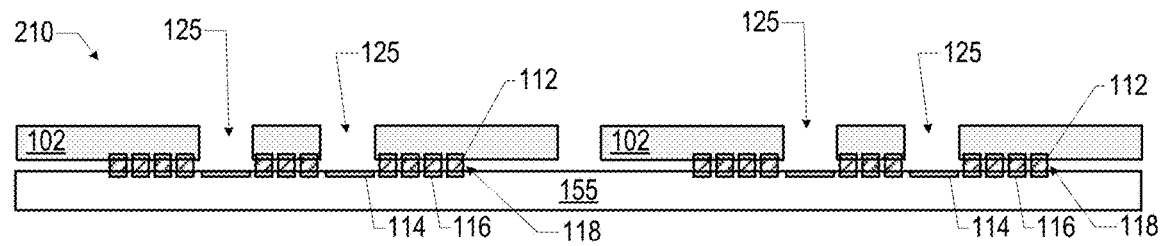

FIG. 8F illustrates an assembly 210 subsequent to "flipping" the through-hole dies 102 of the assembly 208 (FIG. 8E) and attaching the through-hole dies 102 to conductive contacts 116 on a wafer 155 via the FLI 118 (e.g., using a mass reflow process). The wafer 155 may also include conductive contacts 114 on the same surface as the conductive contacts 116. Later in the manufacturing process, the wafer 155 will be singulated to form multiple units of the quantum processing die 104, and thus the wafer 155 represents repeating units of the quantum processing die 104 (with the conductive contacts 114/116 repeated accordingly). If a seal material 149 between the quantum processing die 104 and the through-hole die 102 is desired (e.g., as discussed above with reference to FIG. 6), the seal material 149 may be formed before, after, or concurrently with the attachment of the quantum processing die 104 to the through-hole die 102.

Figure 8G:
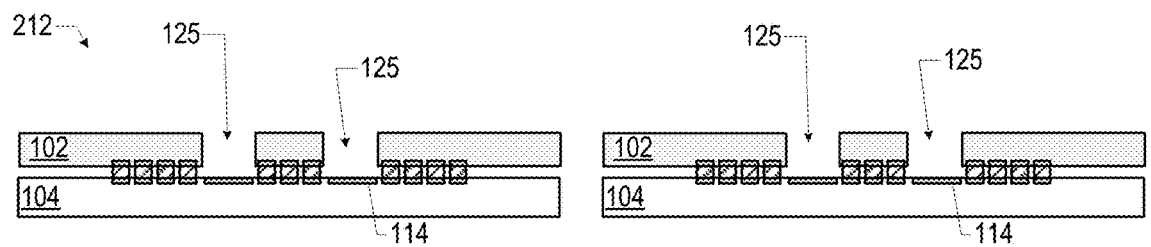

FIG. 8G illustrates an assembly 212 subsequent to singulating the wafer 155 of the assembly 210 (FIG. 8F) to separate different ones of the quantum processing dies 104 from each other, as shown. In some embodiments, a diamond saw or laser may be used to perform this singulation.

Figure 8H:
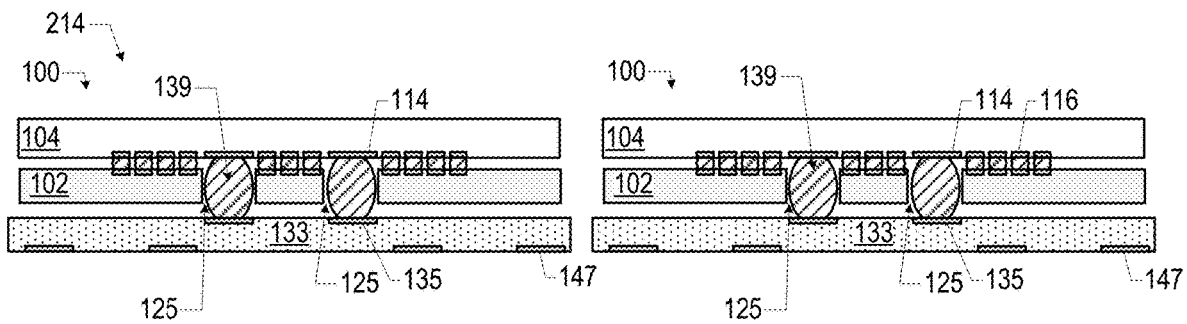

FIG. 8H illustrates an assembly 214 subsequent to attaching the quantum processing die 104/through-hole die 102 assemblies of the assembly 212 (FIG. 8G) to package substrates 133 via FLI 139 through the through-holes 125.

The assembly 214 thus includes multiple units of the quantum computing assembly 100 of FIG. 1. If the through-hole die 102 includes conductive contacts 110 (e.g., as discussed above with reference to FIG. 2), FLI 137 between the conductive contacts 110 and corresponding conductive contacts 135 of the package substrate 133 may be formed concurrently with the formation of the FLI 139. If an underfill material is desired between the through-hole die 102 and the package substrate 133 (e.g., as discussed above with reference to FIG. 3), the underfill material may be formed after the quantum processing die 104/through-hole die 102 is attached to the package substrate, as known in the art. Further operations may be performed as suitable (e.g., providing a TIM on the quantum processing die 104, providing a heat spreader, attaching additional dies to the package substrate 133, forming SLI to couple the package substrate 133 to a circuit board, etc.).

Figure 9A:
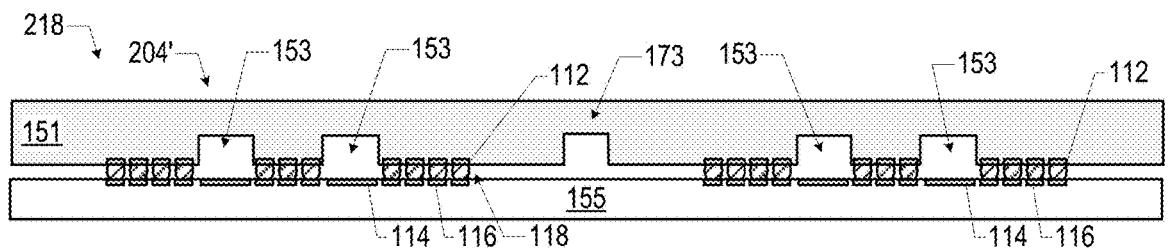
FIGS. 9A-9B are cross-sectional views of various stages in an example process for manufacturing an example quantum computing assembly, in accordance with various embodiments.
Figure 9B:
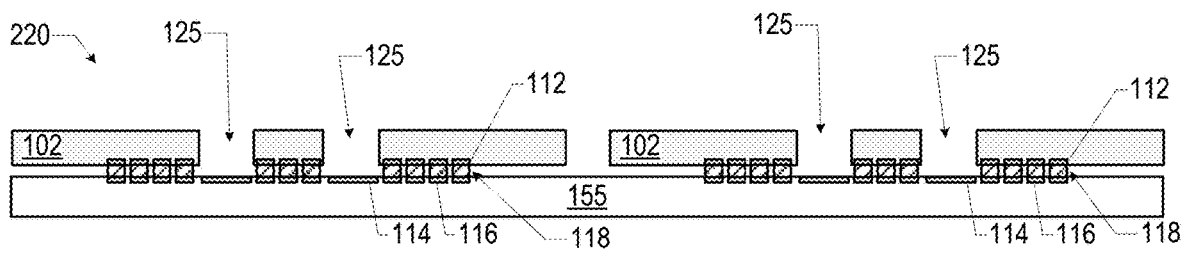

FIGS. 9A-9B are side, cross-sectional views of various stages in another example process for manufacturing the quantum computing assembly 100 of FIG. 1, in accordance with various embodiments. The manufacturing process illustrated in FIG. 8 may be particularly advantageous when the through-hole die 102 is thicker, while the manufacturing process illustrated in FIG. 9 may be particularly advantageous when the through-hole die 102 is thinner. The operations of FIG. 9 begin with the assembly 204 (FIG. 8C).

FIG. 9A illustrates an assembly 218 subsequent to "flipping" an assembly 204' that is like the assembly 204 (FIG. 8C) but also includes an additional recess 173 (at the boundary between two dies 102, as discussed below) and attaching the assembly 204' to conductive contacts 116 on a wafer 155 via the FLI 118. As discussed above with reference to FIG. 8F, the wafer 155 may also include conductive contacts 114 on the same surface as the conductive contacts 116. Later in the manufacturing process, the wafer 155 will be singulated to form multiple units of the quantum processing die 104, and thus the wafer 155 represents repeating units of the quantum processing die 104 (with the conductive contacts 114/116 repeated accordingly). If a seal material 149 between the quantum processing die 104 and the through-hole die 102 is desired (e.g., as discussed above with reference to FIG. 6), the seal material 149 may be formed before, after, or concurrently with the attachment of the quantum processing die 104 to the through-hole die 102.

FIG. 9B illustrates an assembly 220 subsequent to grinding the exposed surface of the wafer 151 in the assembly 218 (FIG. 9A). The grinding operation (which may also include etching, as desired) may "thin" the wafer 151 until the recesses 153 of the assembly 218 become the through-holes 125, as shown, and the recess 173 becomes the space between two adjacent dies 102. Processing of the assembly 220 may proceed as discussed above with reference to FIGS. 8G-8H to form the quantum computing assemblies 100.

FIGS. 10A-10D are side, cross-sectional views of various stages in another example process for manufacturing a quantum computing assembly 100 (in particular, the quantum computing assembly 100 of FIG. 7), in accordance with various embodiments. The process of FIG. 10 may impart additional mechanical stability during manufacturing. The operations of FIG. 10 begin with the assembly 204 (FIG. 8C).

Figure 10A:
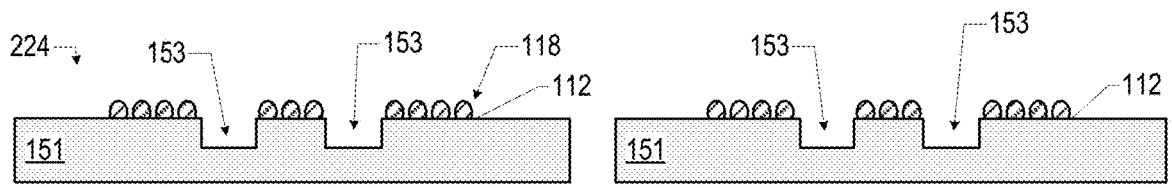
FIGS. 10A-10D are cross-sectional views of various stages in an example process for manufacturing an example quantum computing assembly, in accordance with various embodiments.

FIG. 10A illustrates an assembly 224 subsequent to singulating the wafer 151 of the assembly 204 (FIG. 8C) to form portions of the wafer 151 (corresponding to different ones of the through-hole dies 102), as shown. In some embodiments, a diamond saw or laser may be used to perform this singulation.

Figure 10B:
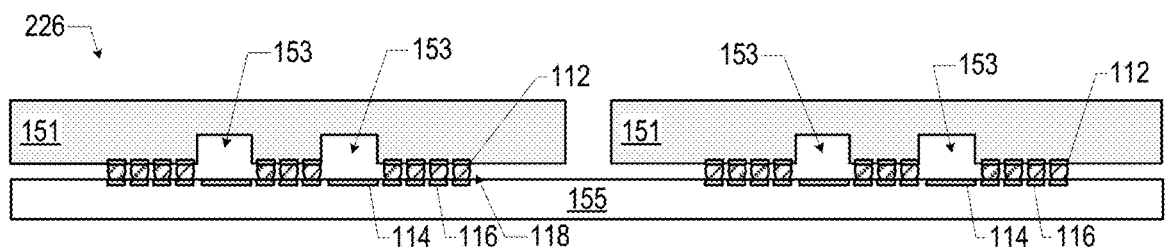

FIG. 10B illustrates an assembly 226 subsequent to "flipping" the portions of the wafer 151 of the assembly 224 (FIG. 10A) and attaching the portions of the wafer 151 to conductive contacts 116 on a wafer 155 via the FLI 118. The wafer 155 may also include conductive contacts 114 on the same surface as the conductive contacts 116. Later in the manufacturing process, the wafer 155 will be singulated to form multiple units of the quantum processing die 104, and thus the wafer 155 represents repeating units of the quantum processing die 104 (with the conductive contacts 114/116 repeated accordingly). If a seal material 149 between the quantum processing die 104 and the through-hole die 102 is desired (e.g., as discussed above with reference to FIG. 6), the seal material 149 may be formed before, after, or concurrently with the attachment of the quantum processing die 104 to the portions of the wafer 151.

Figure 10C:
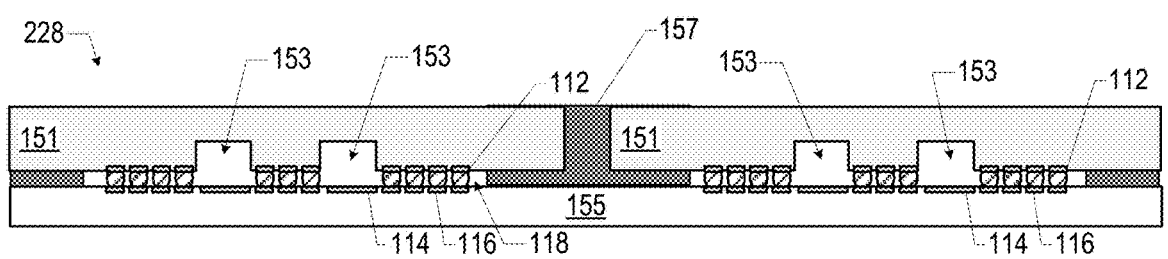

FIG. 10C illustrates an assembly 228 subsequent to forming mold material 157 between the portions of the wafer 151 and between the portions of the wafer 151 and the wafer 155 (proximate to the perimeter of the portions of the wafer 151) in the assembly 226 (FIG. 10B). The mold material 157 may provide mechanical rigidity to the assembly 228.

Figure 10D:
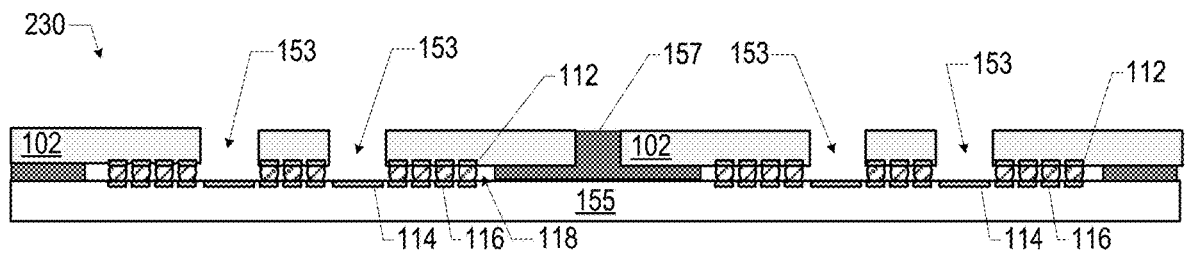

FIG. 10D illustrates an assembly 230 subsequent to grinding the exposed surface of the wafer 151 in the assembly 228 (FIG. 10C). The grinding operation (which may also include etching, as desired) may "thin" the wafer 151 until the recesses 153 of the assembly 228 become the through-holes 125, as shown, and the portions of the wafer 151 become the through-hole dies 102. The wafer 155 may then be singulated as discussed above with reference to FIG. 8G (cutting the mold material 157 between the through-hole dies 102 at the same time), and processing of the resulting assembly may proceed as discussed above with reference to FIG. 8H to form the quantum computing assembly 100.

Figure 11:
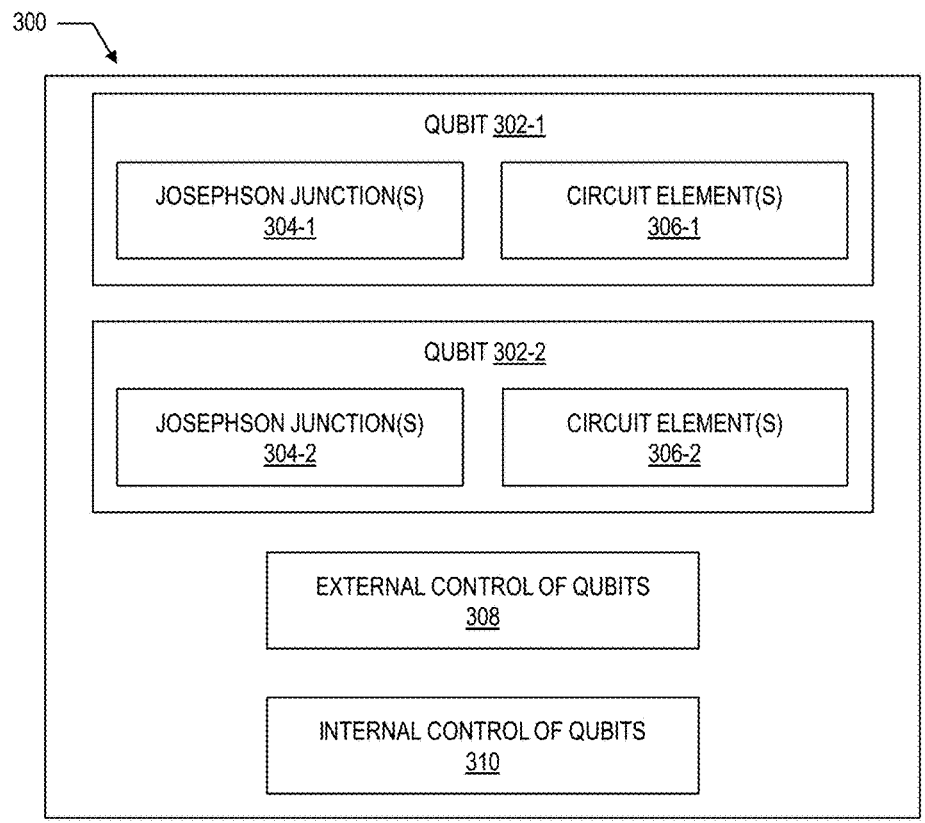
FIG. 11 is a block diagram of an example superconducting qubit-type quantum device, in accordance with various embodiments.
Figure 12:
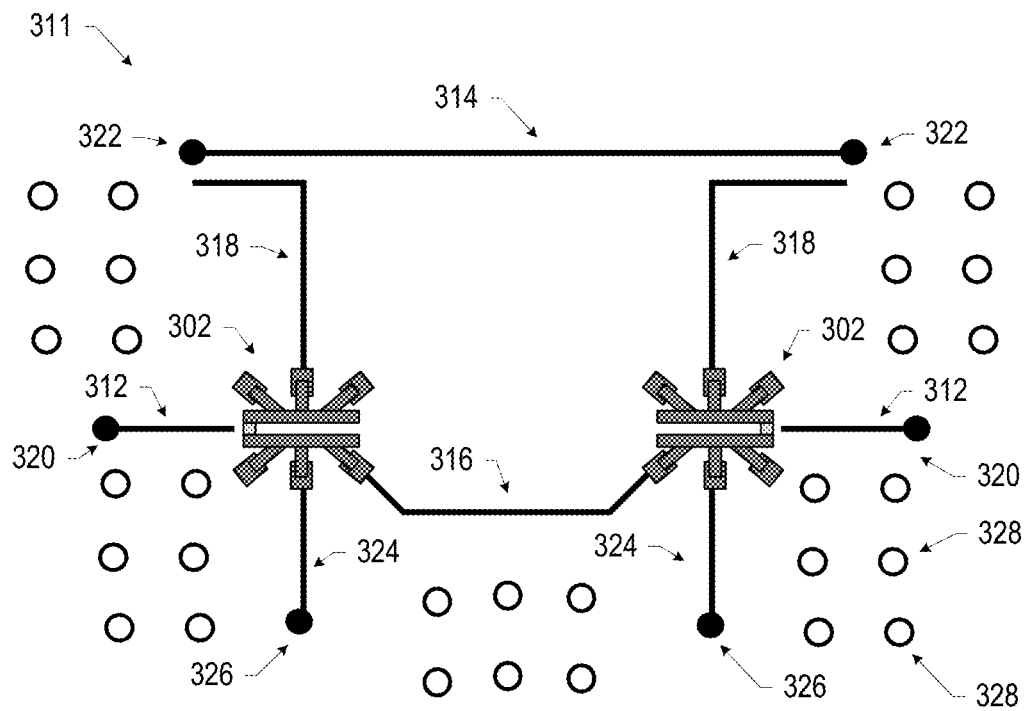
FIGS. 12 and 13 illustrate example physical layouts of superconducting qubit-type quantum devices, in accordance with various embodiments.
Figure 13:
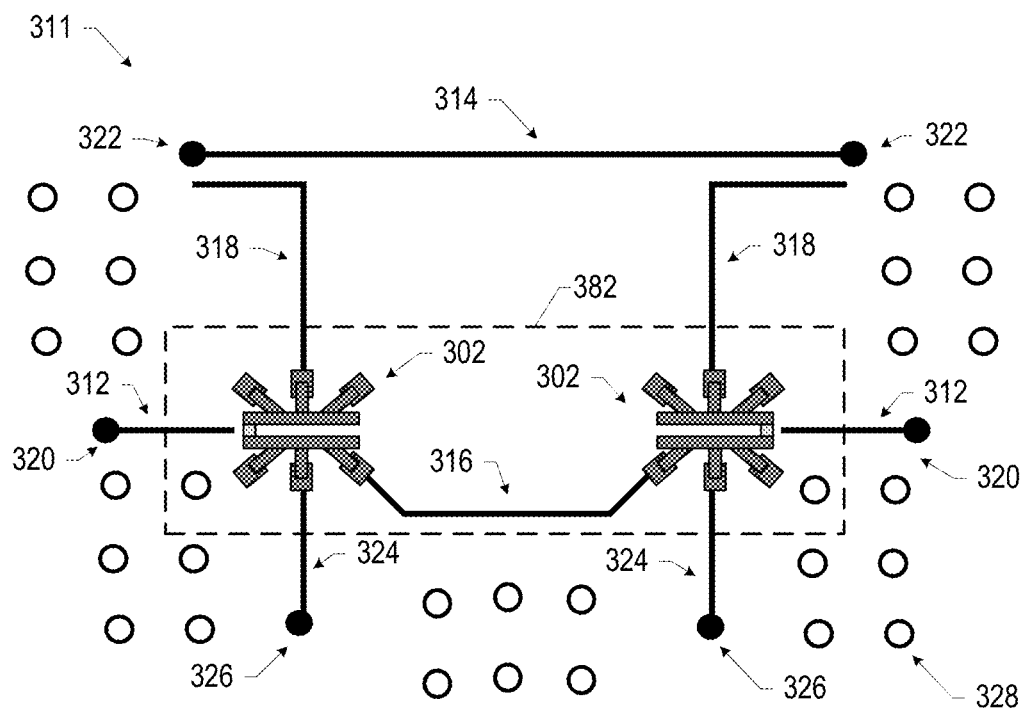

Any of the quantum computing assemblies 100 disclosed herein may include quantum computing circuitry distributed in any suitable manner between the quantum processing die 104/through-hole die 102 therein. FIGS. 11-15 discuss various examples of quantum computing circuitry that may be distributed among the quantum processing die 104/through-hole die 102 of any of the quantum computing assemblies 100 disclosed herein. FIGS. 11-13 discuss example embodiments in which the quantum computing circuitry is superconducting qubit-type quantum computing circuitry, and FIGS. 14-15 discuss example embodiments in which the quantum computing circuitry is spin qubit-type quantum computing circuitry.

The operation of superconducting qubit-type quantum devices may be based on the Josephson effect, a macroscopic quantum phenomenon in which a supercurrent (a current that, due to zero electrical resistance, flows for indefinitely long without any voltage applied) flows across a device known as a Josephson junction. Examples of superconducting qubit-type quantum devices may include charge qubits, flux qubits, and phase qubits. Transmons, a type of charge qubit with the name being an abbreviation of "transmission line shunted plasma oscillation qubits," may exhibit reduced sensitivity to charge noise, and thus may be particularly advantageous. Transmon-type quantum devices may include inductors, capacitors, and at least one nonlinear element (e.g., a Josephson junction) to achieve an effective two-level quantum state system.

Josephson junctions may provide the central circuit elements of a superconducting qubit-type quantum device. A Josephson junction may include two superconductors connected by a weak link. For example, a Josephson junction may be implemented as a thin layer of an insulating material, referred to as a barrier or a tunnel barrier and serving as the "weak link" of the junction, sandwiched between two layers of superconductor. Josephson junctions may act as superconducting tunnel junctions. Cooper pairs may tunnel across the barrier from one superconducting layer to the other. The electrical characteristics of this tunneling are governed by the Josephson relations. Because the inductance of a Josephson junction is nonlinear, when used in an inductor-capacitor circuit (which may be referred to as an LC circuit) in a transmon-type quantum device, the resulting circuit has uneven spacing between its energy states. In other classes of superconducting qubit-type quantum devices, Josephson junctions combined with other circuit elements may similarly provide the non-linearity necessary for forming an effective two-level quantum state to act as a qubit.

FIG. 11 is a block diagram of an example superconducting quantum circuit 300 that may be included in a quantum processing die 104/through-hole die 102 of a quantum computing assembly 100. As shown in FIG. 11, a superconducting quantum circuit 300 includes two or more qubit elements, 302-1 and 302-2. Qubit elements 302-1 and 302-2 may be identical and thus the discussion of FIG. 11 may refer generally to the "qubit elements 302"; the same applies to Josephson junctions 304-1 and 304-2, which may generally be referred to as "Josephson junctions 304," and to circuit elements 306-1 and 306-2, which may generally be referred to as "circuit elements 306." As shown in FIG. 11, each of the superconducting qubit elements 302 may include one or more Josephson junctions 304 connected to one or more other circuit elements 306, which, in combination with the Josephson junction(s) 304, may form a nonlinear circuit providing a unique two-level quantum state for the qubit. The circuit elements 306 could be, for example, capacitors in transmons or superconducting loops in flux qubits.

A superconducting quantum circuit 300 may include circuitry 308 for providing external control of qubit elements 302 and circuitry 310 for providing internal control of qubit elements 302. In this context, "external control" refers to controlling the qubit elements 302 from outside of the die that includes the qubit elements 302, including control by a user of a quantum computer, while "internal control" refers to controlling the qubit elements 302 within the die that includes the qubit elements 302. For example, if qubit elements 302 are transmon qubit elements, external control may be implemented by means of flux bias lines (also known as "flux lines" and "flux coil lines") and by means of readout and drive lines (also known as "microwave lines" since qubit elements are typically designed to operate with microwave signals), described in greater detail below. On the other hand, internal control lines for such qubit elements may be implemented by means of resonators (e.g., coupling and readout resonators, also described in greater detail below).

FIG. 12 illustrates an example of a physical layout 311 of a superconducting quantum circuit where qubit elements are implemented as transmons. Like FIG. 11, FIG. 12 illustrates two qubit elements 302. In addition, FIG. 12 illustrates flux bias lines 312, microwave lines 314, a coupling resonator 316, a readout resonator 318, and conductive contacts 320 and 322. The flux bias lines 312 and the microwave lines 314 may be viewed as examples of the external control circuitry 308 shown in FIG. 11.

Running a current through the flux bias lines 312, provided from the conductive contacts 320, enables the tuning of the frequency of the corresponding qubit elements 302 to which each line 312 is connected. For example, a magnetic field is created by running the current in a particular flux bias line 312. If such a magnetic field is in sufficient proximity to the qubit element 302, the magnetic field couples to the qubit element 302, thereby changing the spacing between the energy levels of the qubit element 302. This, in turn, changes the frequency of the qubit element 302 since the frequency is related to the spacing between the energy levels via Planck's equation. Provided there is sufficient multiplexing, different currents can be sent down each of the flux lines 312, allowing for independent tuning of the various qubit elements 302.

Typically, the qubit frequency may be controlled to bring the frequency either closer to or further away from another resonant element, such as a coupling resonator 316 as shown in FIG. 12 that connects two or more qubit elements 302 together. For example, if it is desired that a first qubit element 302 (e.g. the qubit element 302 shown on the left side of FIG. 12) and a second qubit element 302 (e.g. the qubit element 302 shown on the right side of FIG. 12) interact, via the coupling resonator 316 connecting these qubit elements, then both qubit elements 302 may be tuned at nearly the same frequency. In other scenarios, two qubit elements 302 could interact via a coupling resonator 316 at specific frequencies, but these three elements do not have to be tuned to be at nearly the same frequency with one another. Interactions between the qubit elements 302 can similarly be reduced or prevented by controlling the current in the appropriate flux bias lines. The state(s) of each qubit element 302 may be read by way of its corresponding readout resonator 318. As discussed below, the qubit element 302 may induce a resonant frequency in the readout resonator 318. This resonant frequency is then passed to the microwave lines 314 and communicated to the conductive contacts 322.

A readout resonator 318 may be provided for each qubit element. The readout resonator 318 may be a transmission line that includes a capacitive connection to ground on one side and is either shorted to ground on the other side (for a quarter-wavelength resonator) or has a capacitive connection to ground (for a half-wavelength resonator), which results in oscillations within the transmission line (resonance). The resonant frequency of the oscillations may be close to the frequency of the qubit element 302. The readout resonator 318 may be coupled to the qubit element 302 by being in sufficient proximity to the qubit element 302 (e.g., through capacitive or inductive coupling). Due to the coupling between the readout resonator 318 and the qubit element 302, changes in the state of the qubit element 302 may result in changes of the resonant frequency of the readout resonator 318. In turn, because the readout resonator 318 is in sufficient proximity to the microwave line 314, changes in the resonant frequency of the readout resonator 318 may induce changes in the current in the microwave line 314, and that current can be read externally via the conductive contacts 322.

The coupling resonator 316 may be used to couple different qubit elements together to realize quantum logic gates. The coupling resonator 316 may be similar to the readout resonator 318 in that it is a transmission line that may include capacitive connections to ground on both sides (for a half-wavelength resonator), which may result in oscillations within the coupling resonator 316. Each side of the coupling resonator 316 may be coupled (again, either capacitively or inductively) to a respective qubit element 302 by being in sufficient proximity to the qubit element 302. Because each side of the coupling resonator 316 couples with a respective different qubit element 302, the two qubit elements 302 may be coupled together through the coupling resonator 316. In this manner, a state of one qubit element 302 may depend on the state of the other qubit element 302, and vice versa. Thus, coupling resonators 316 may be employed to use a state of one qubit element 302 to control a state of another qubit element 302.

In some implementations, the microwave line 314 may be used to not only readout the state of the qubit elements 302 as described above, but also to control the state of the qubit elements 302. When a single microwave line 314 is used for this purpose, the line 314 may operate in a half-duplex mode in which, at some times, it is configured to readout the state of the qubit elements 302, and, at other times, it is configured to control the state of the qubit elements 302. In other implementations, microwave lines such as the line 314 shown in FIG. 12 may be used to only readout the state of the qubit elements as described above, while separate drive lines (such as the drive lines 324 shown in FIG. 12) may be used to control the state of the qubit elements 302. In such implementations, the microwave lines used for readout may be referred to as readout lines (e.g., the readout line 314), while microwave lines used for controlling the state of the qubit elements may be referred to as drive lines (e.g., the drive lines 324). The drive lines 324 may control the state of their respective qubit elements 302 by providing (e.g., using conductive contacts 326 as shown in FIG. 12) a microwave pulse at the qubit frequency, which in turn stimulates a transition between the states of the qubit element 302. By varying the length of this pulse, a partial transition can be stimulated, giving a superposition of the states of the qubit element 302.

Flux bias lines, microwave lines, coupling resonators, drive lines, and readout resonators, such as those described above, together form interconnects for supporting propagation of microwave signals. Further, any other connections for providing direct electrical interconnection between different quantum circuit elements and components, such as connections from Josephson junction electrodes to capacitor plates or to superconducting loops of superconducting quantum interference devices (SQUIDS) or connections between two ground lines of a particular transmission line for equalizing electrostatic potential on the two ground lines, are also referred to herein as interconnects. Electrical interconnections may also be provided between quantum circuit elements and components and non-quantum circuit elements, which may also be provided in a quantum circuit, as well as to electrical interconnections between various non-quantum circuit elements provided in a quantum circuit. Examples of non-quantum circuit elements that may be provided in a quantum circuit may include various analog and/or digital systems, e.g. analog-to-digital converters, mixers, multiplexers, amplifiers, etc. In some embodiments, these non-quantum elements may be included in a control die.

Coupling resonators and readout resonators may be configured for capacitive coupling to other circuit elements at one or both ends to have resonant oscillations, whereas flux bias lines and microwave lines may be similar to conventional microwave transmission lines because there is no resonance in these lines. Each one of these interconnects may be implemented as any suitable architecture of a microwave transmission line, such as a coplanar waveguide, a stripline, a microstrip line, or an inverted microstrip line. Typical materials that may be included in the interconnects may include aluminum, niobium, niobium nitride, titanium nitride, molybdenum rhenium, and niobium titanium nitride, all of which are particular types of superconductors. However, in various embodiments, other suitable superconductors and alloys of superconductors may be used as well.

In various embodiments, the interconnects as shown in FIG. 12 could have different shapes and layouts. For example, some interconnects may comprise more curves and turns while other interconnects may comprise fewer curves and turns, and some interconnects may comprise substantially straight lines. In some embodiments, various interconnects may intersect one another, in such a manner that they don't make an electrical connection, which can be done by using a bridge to bridge one interconnect over the other, for example.

In addition, FIG. 12 further illustrates ground contacts 328, connecting to the ground plane (which may be provided by, for example, the through-hole die 102). Such ground contacts 328 may be used when a die supports propagation of microwave signals to suppress microwave parallel plate modes, cross-coupling between circuit blocks, and/or substrate resonant modes. In general, providing ground pathways may improve signal quality, enable fast pulse excitation, and improve the isolation between the different lines.

Only two ground contacts are labeled in FIG. 12 with the reference numeral 328, but all white circles shown throughout FIG. 12 may illustrate exemplary locations of ground conductive contacts. The illustration of the location and the number of the ground contacts 328 in FIG. 12 is purely illustrative and, in various embodiments, ground contacts 328 may be provided at different places, as known in microwave engineering. More generally, any number of qubit elements 302, flux bias lines 312, microwave lines 314, coupling resonators 316, readout resonators 318, drive lines 324, contacts 320, 322, 326, and 328, and other components discussed herein with reference to the superconducting quantum circuit 300 may be included in a quantum computing assembly 100.

While FIGS. 11 and 12 illustrate examples of quantum circuits comprising only two qubit elements 302, embodiments with any larger number of qubit elements are possible and are within the scope of the present disclosure. Furthermore, while FIGS. 11 and 12 may illustrate various features specific to transmon-type quantum devices, the quantum computing assemblies 100 disclosed herein may include quantum circuits implementing other types of superconducting qubit elements.

In some embodiments, the bottom surface 122 of the quantum processing die 104 or the top surface 108 of the through-hole die 102 may be coated with a solder resist material (not shown). The solder resist may include silicon nitride, aluminum oxide, or silicon oxide, for example. Because the solder resist material may be lossy, it may be advantageous to avoid using solder resist material proximate to or around the coupling resonators 316. FIG. 13 illustrates the superconducting qubit-type quantum device 300 of FIG. 12 with an example area 382 around the resonator 316 in which no solder resist is provided. As discussed below, positioning a lossy material close to the resonators 316 may create spurious two-level systems that may compromise performance of the quantum computing circuitry (e.g., by leading to qubit decoherence).

Figure 14A:
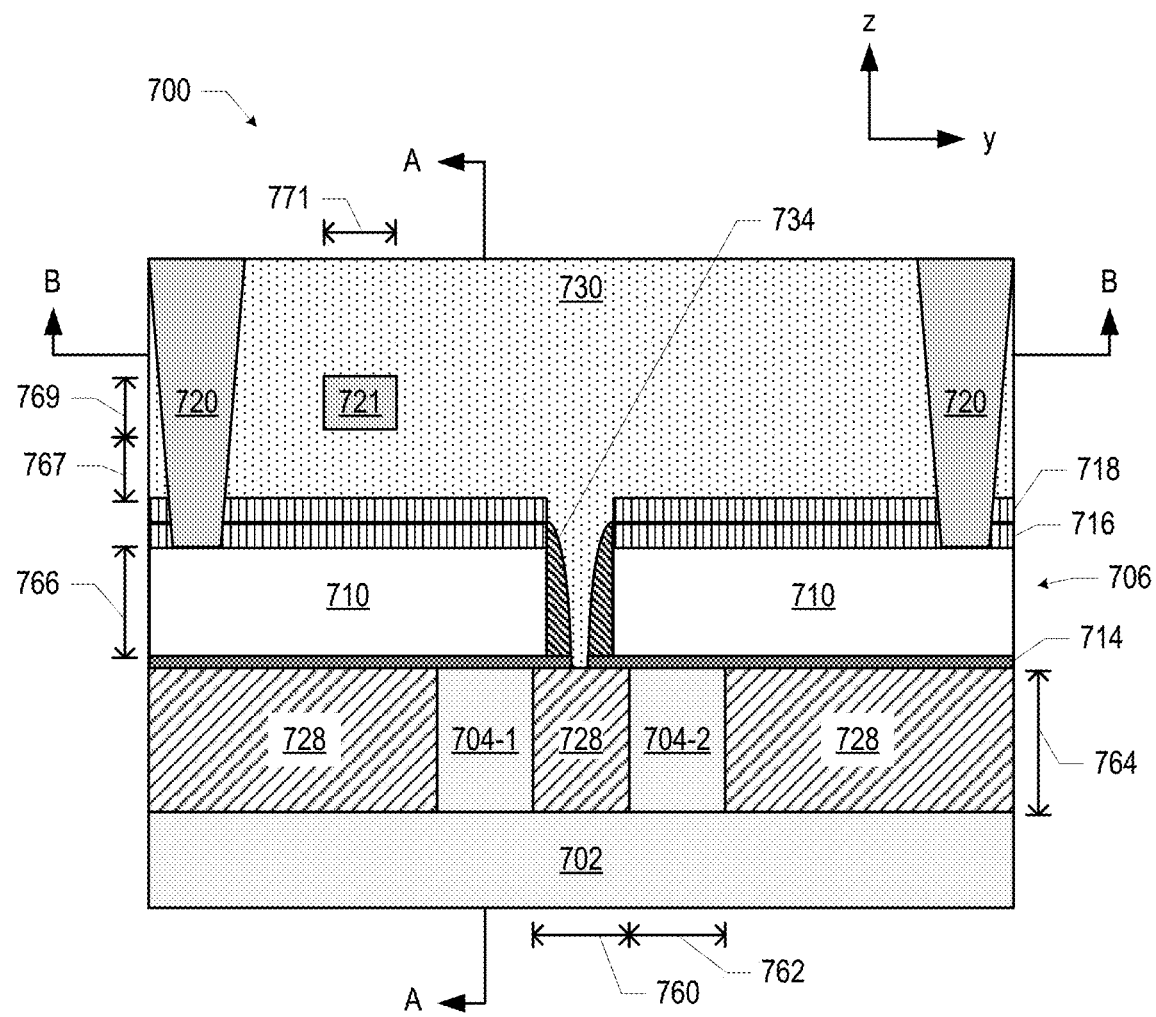
FIGS. 14A-14C are cross-sectional views of a spin qubit-type quantum device, in accordance with various embodiments.
Figure 14B:
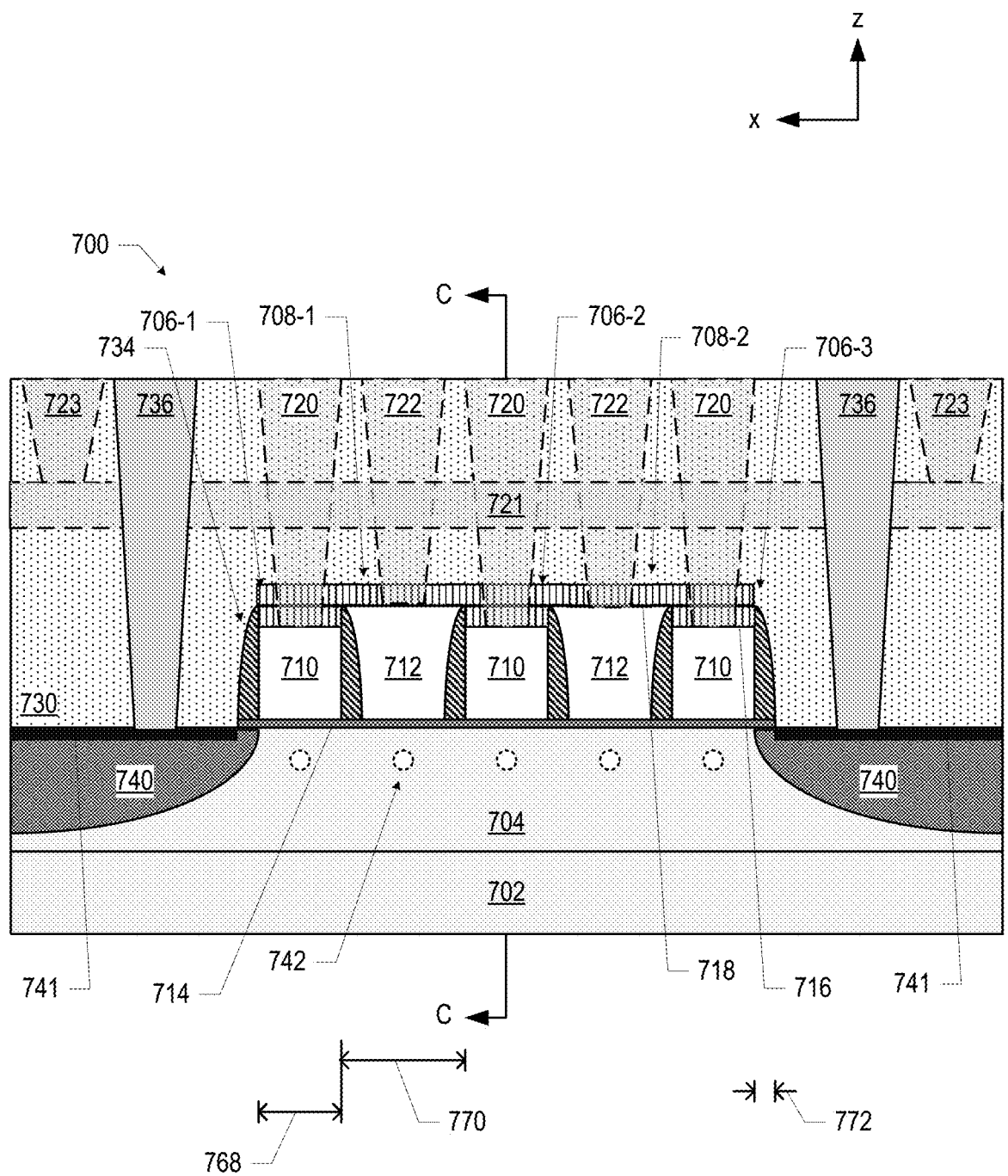
Figure 14C:
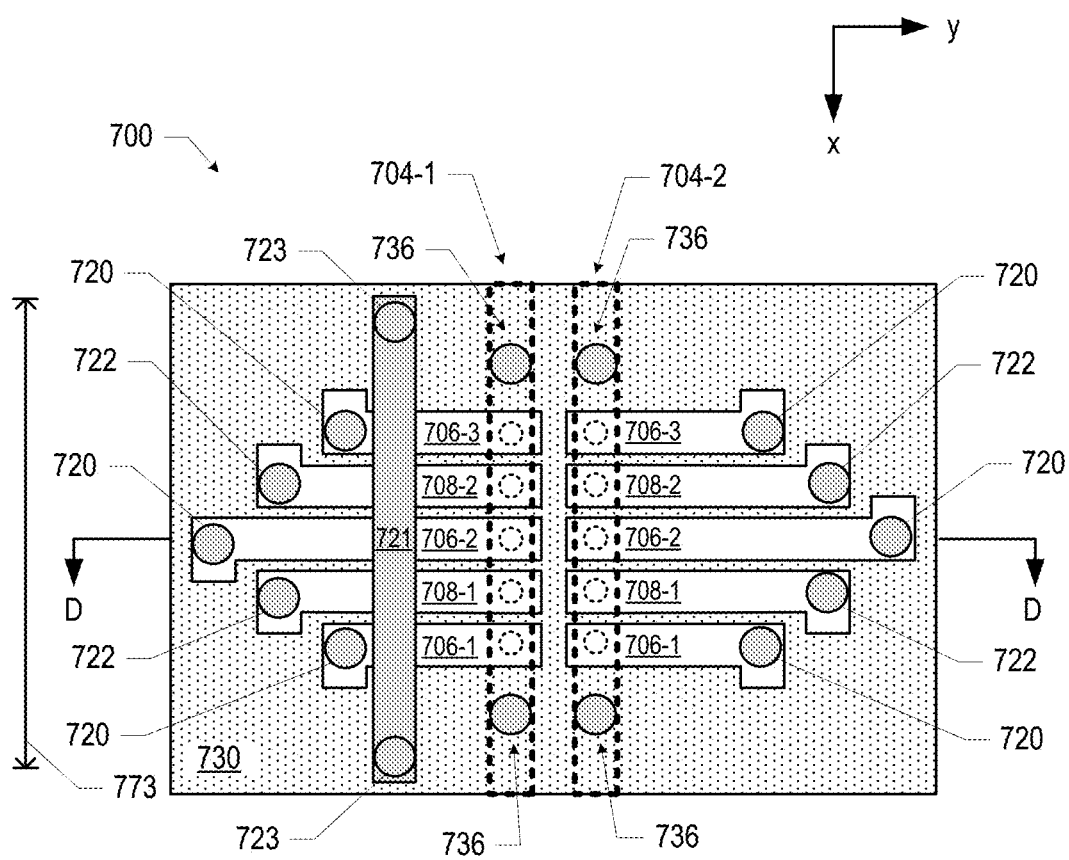

As noted above, in some embodiments, a quantum computing assembly 100 may include spin qubit-type quantum devices in one or more of the quantum processing die 104/through-hole die 102. FIG. 14 depicts cross-sectional views of an example spin qubit-type quantum device 700, in accordance with various embodiments. In particular, FIG. 14B illustrates the spin qubit-type quantum device 700 taken along the section A-A of FIG. 14A (while FIG. 14A illustrates the spin qubit-type quantum device 700 taken along the section C-C of FIG. 14B), and FIG. 14C illustrates the spin qubit-type quantum device 700 taken along the section B-B of FIG. 14A with a number of components not shown to more readily illustrate how the gates 706/708 and the magnet line 721 may be patterned (while FIG. 14A illustrates a spin qubit-type quantum device 700 taken along the section D-D of FIG. 14C). Although FIG. 14A indicates that the cross-section illustrated in FIG. 14B is taken through the fin 704-1, an analogous cross-section taken through the fin 704-2 may be identical, and thus the discussion of FIG. 14B refers generally to the "fin 704." The spin qubit-type quantum device 700 is simply illustrative, and other spin qubit-type quantum devices may be included in a quantum computing assembly 100.

The spin qubit-type quantum device 700 may include a base 702 and multiple fins 704 extending away from the base 702. The base 702 and the fins 704 may include a substrate and a quantum well stack (not shown in FIG. 14, but discussed below with reference to the substrate 744 and the quantum well stack 746), distributed in any of a number of ways between the base 702 and the fins 704. The base 702 may include at least some of the substrate, and the fins 704 may each include a quantum well layer of the quantum well stack (discussed below with reference to the quantum well layer 752).

Although only two fins, 704-1 and 704-2, are shown in FIG. 14, this is simply for ease of illustration, and more than two fins 704 may be included in the spin qubit-type quantum device 700. In some embodiments, the total number of fins 704 included in the spin qubit-type quantum device 700 is an even number, with the fins 704 organized into pairs including one active fin 704 and one read fin 704, as discussed in detail below. When the spin qubit-type quantum device 700 includes more than two fins 704, the fins 704 may be arranged in pairs in a line (e.g., 2N fins total may be arranged in a 1×2N line, or a 2×N line) or in pairs in a larger array (e.g., 2N fins total may be arranged as a 4×N/2 array, a 6×N/3 array, etc.). The discussion herein will largely focus on a single pair of fins 704 for ease of illustration, but all the teachings of the present disclosure apply to spin qubit-type quantum devices 700 with more fins 704.

As noted above, each of the fins 704 may include a quantum well layer (not shown in FIG. 14, but discussed below with reference to the quantum well layer 752). The quantum well layer included in the fins 704 may be arranged normal to the z-direction, and may provide a layer in which a two-dimensional electron gas (2DEG) may form to enable the generation of a quantum dot during operation of the spin qubit-type quantum device 700, as discussed in further detail below. The quantum well layer itself may provide a geometric constraint on the z-location of quantum dots in the fins 704, and the limited extent of the fins 704 (and therefore the quantum well layer) in the y-direction may provide a geometric constraint on the y-location of quantum dots in the fins 704. To control the x-location of quantum dots in the fins 704, voltages may be applied to gates disposed on the fins 704 to adjust the energy profile along the fins 704 in the x-direction and thereby constrain the x-location of quantum dots within quantum wells (discussed in detail below with reference to the gates 706/708). The dimensions of the fins 704 may take any suitable values. For example, in some embodiments, the fins 704 may each have a width 762 between 10 nanometers and 30 nanometers. In some embodiments, the fins 704 may each have a height 764 between 200 nanometers and 400 nanometers (e.g., between 250 nanometers and 350 nanometers, or equal to 300 nanometers).

The fins 704 may be arranged in parallel, as illustrated in FIGS. 14A and 14C, and may be spaced apart by an insulating material 728, which may be disposed on opposite faces of the fins 704. The insulating material 728 may be a dielectric material, such as silicon oxide. For example, in some embodiments, the fins 704 may be spaced apart by a distance 760 between 100 nanometers and 250 nanometers.

Multiple gates may be disposed on each of the fins 704. In the embodiment illustrated in FIG. 14B, three gates 706 and two gates 708 are shown as distributed on the top of the fin 704. This particular number of gates is simply illustrative, and any suitable number of gates may be used.

As shown in FIG. 14B, the gate 708-1 may be disposed between the gates 706-1 and 706-2, and the gate 708-2 may be disposed between the gates 706-2 and 706-3. Each of the gates 706/708 may include a gate dielectric 714; in the embodiment illustrated in FIG. 14B, the gate dielectric 714 for all the gates 706/708 is provided by a common layer of gate dielectric material. In other embodiments, the gate dielectric 714 for each of the gates 706/708 may be provided by separate portions of gate dielectric 714. In some embodiments, the gate dielectric 714 may be a multilayer gate dielectric (e.g., with multiple materials used to improve the interface between the fin 704 and the corresponding gate metal). The gate dielectric 714 may be, for example, silicon oxide, aluminum oxide, or a high-k dielectric, such as hafnium oxide. More generally, the gate dielectric 714 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 714 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 714 to improve the quality of the gate dielectric 714.

Each of the gates 706 may include a gate metal 710 and a hardmask 716. The hardmask 716 may be formed of silicon nitride, silicon carbide, or another suitable material. The gate metal 710 may be disposed between the hardmask 716 and the gate dielectric 714, and the gate dielectric 714 may be disposed between the gate metal 710 and the fin 704. Only one portion of the hardmask 716 is labeled in FIG. 14B for ease of illustration. In some embodiments, the gate metal 710 may be a superconductor, such as aluminum, titanium nitride (e.g., deposited via atomic layer deposition (ALD)), or niobium titanium nitride. In some embodiments, the hardmask 716 may not be present in the spin qubit-type quantum device 700 (e.g., a hardmask like the hardmask 716 may be removed during processing, as discussed below). The sides of the gate metal 710 may be substantially parallel, as shown in FIG. 14B, and insulating spacers 734 may be disposed on the sides of the gate metal 710 and the hardmask 716. As illustrated in FIG. 14B, the spacers 734 may be thicker closer to the fin 704 and thinner farther away from the fin 704. In some embodiments, the spacers 734 may have a convex shape. The spacers 734 may be formed of any suitable material, such as a carbon-doped oxide, silicon nitride, silicon oxide, or other carbides or nitrides (e.g., silicon carbide, silicon nitride doped with carbon, and silicon oxynitride). The gate metal 710 may be any suitable metal, such as titanium nitride.

Each of the gates 708 may include a gate metal 712 and a hardmask 718. The hardmask 718 may be formed of silicon nitride, silicon carbide, or another suitable material. The gate metal 712 may be disposed between the hardmask 718 and the gate dielectric 714, and the gate dielectric 714 may be disposed between the gate metal 712 and the fin 704. In the embodiment illustrated in FIG. 14B, the hardmask 718 may extend over the hardmask 716 (and over the gate metal 710 of the gates 706), while in other embodiments, the hardmask 718 may not extend over the gate metal 710. In some embodiments, the gate metal 712 may be a different metal from the gate metal 710; in other embodiments, the gate metal 712 and the gate metal 710 may have the same material composition. In some embodiments, the gate metal 712 may be a superconductor, such as aluminum, titanium nitride (e.g., deposited via ALD), or niobium titanium nitride. In some embodiments, the hardmask 718 may not be present in the spin qubit-type quantum device 700 (e.g., a hardmask like the hardmask 718 may be removed during processing, as discussed below).

The gate 708-1 may extend between the proximate spacers 734 on the sides of the gate 706-1 and the gate 706-2, as shown in FIG. 14B. In some embodiments, the gate metal 712 of the gate 708-1 may extend between the spacers 734 on the sides of the gate 706-1 and the gate 706-2. Thus, the gate metal 712 of the gate 708-1 may have a shape that is substantially complementary to the shape of the spacers 734, as shown. Similarly, the gate 708-2 may extend between the proximate spacers 734 on the sides of the gate 706-2 and the gate 706-3. In some embodiments in which the gate dielectric 714 is not a layer shared commonly between the gates 708 and 706, but instead is separately deposited on the fin 704 between the spacers 734, the gate dielectric 714 may extend at least partially up the sides of the spacers 734, and the gate metal 712 may extend between the portions of gate dielectric 714 on the spacers 734. The gate metal 712, like the gate metal 710, may be any suitable metal, such as titanium nitride.

The dimensions of the gates 706/708 may take any suitable values. For example, in some embodiments, the z-height 766 of the gate metal 710 may be between 40 nanometers and 75 nanometers (e.g., approximately 50 nanometers); the z-height of the gate metal 712 may be in the same range. In embodiments like the ones illustrated in FIG. 14B, the z-height of the gate metal 712 may be greater than the z-height of the gate metal 710. In some embodiments, the length 768 of the gate metal 710 (i.e., in the x-direction) may be between 20 nanometers and 40 nanometers (e.g., 30 nanometers). In some embodiments, the distance 770 between adjacent ones of the gates 706 (e.g., as measured from the gate metal 710 of one gate 706 to the gate metal 710 of an adjacent gate 706 in the x-direction, as illustrated in FIG. 14B), may be between 40 nanometers and 60 nanometers (e.g., 50 nanometers). In some embodiments, the thickness 772 of the spacers 734 may be between 1 nanometer and 10 nanometers (e.g., between 3 nanometers and 5 nanometers, between 4 nanometers and 6 nanometers, or between 4 nanometers and 7 nanometers). The length of the gate metal 712 (i.e., in the x-direction) may depend on the dimensions of the gates 706 and the spacers 734, as illustrated in FIG. 14B. As indicated in FIG. 14A, the gates 706/708 on one fin 704 may extend over the insulating material 728 beyond their respective fins 704 and towards the other fin 704, but may be isolated from their counterpart gates by the intervening insulating material 730 and spacers 734.

Although all the gates 706 are illustrated in the accompanying drawings as having the same length 768 of the gate metal 710, in some embodiments, the "outermost" gates 706 (e.g., the gates 706-1 and 706-3 of the embodiment illustrated in FIG. 14B) may have a greater length 768 than the "inner" gates 706 (e.g., the gate 706-2 in the embodiment illustrated in FIG. 14B). Such longer "outside" gates 706 may provide spatial separation between the doped regions 740 and the areas under the gates 708 and the inner gates 706 in which quantum dots 742 may form, and thus may reduce the perturbations to the potential energy landscape under the gates 708 and the inner gates 706 caused by the doped regions 740.

As shown in FIG. 14B, the gates 706 and 708 may be alternatingly arranged along the fin 704 in the x-direction. During operation of the spin qubit-type quantum device 700, voltages may be applied to the gates 706/708 to adjust the potential energy in the quantum well layer (not shown) in the fin 704 to create quantum wells of varying depths in which quantum dots 742 may form. Only one quantum dot 742 is labeled with a reference numeral in FIGS. 14B and 14C for ease of illustration, but five are indicated as dotted circles in each fin 704. The location of the quantum dots 742 in FIG. 14B is not intended to indicate a particular geometric positioning of the quantum dots 742. The spacers 734 may themselves provide "passive" barriers between quantum wells under the gates 706/708 in the quantum well layer, and the voltages applied to different ones of the gates 706/708 may adjust the potential energy under the gates 706/708 in the quantum well layer; decreasing the potential energy may form quantum wells, while increasing the potential energy may form quantum barriers. A gate 706/708 and the portion of the quantum well layer under that gate may serve as a qubit element in spin qubit-type devices.

The fins 704 may include doped regions 740 that may serve as a reservoir of charge carriers for the spin qubit-type quantum device 700. For example, an n-type doped region 740 may supply electrons for electron-type quantum dots 742, and a p-type doped region 740 may supply holes for hole-type quantum dots 742. In some embodiments, an interface material 741 may be disposed at a surface of a doped region 740, as shown. The interface material 741 may facilitate electrical coupling between a conductive contact (e.g., a via 736, as discussed below) and the doped region 740. The interface material 741 may be any suitable metal-semiconductor ohmic contact material; for example, in embodiments in which the doped region 740 includes silicon, the interface material 741 may include nickel silicide, aluminum silicide, titanium silicide, molybdenum silicide, cobalt silicide, tungsten silicide, or platinum silicide. In some embodiments, the interface material 741 may be a non-silicide compound, such as titanium nitride. In some embodiments, the interface material 741 may be a metal (e.g., aluminum, tungsten, or indium).

The spin qubit-type quantum devices 700 disclosed herein may be used to form electron-type or hole-type quantum dots 742. Note that the polarity of the voltages applied to the gates 706/708 to form quantum wells/barriers depends on the charge carriers used in the spin qubit-type quantum device 700. In embodiments in which the charge carriers are electrons (and thus the quantum dots 742 are electron-type quantum dots), amply negative voltages applied to a gate 706/708 may increase the potential barrier under the gate 706/708, and amply positive voltages applied to a gate 706/708 may decrease the potential barrier under the gate 706/708 (thereby forming a potential well in which an electron-type quantum dot 742 may form). In embodiments in which the charge carriers are holes (and thus the quantum dots 742 are hole-type quantum dots), amply positive voltages applied to a gate 706/708 may increase the potential barrier under the gate 706/708, and amply negative voltages applied to a gate 706/708 may decrease the potential barrier under the gate 706/708 (thereby forming a potential well in which a hole-type quantum dot 742 may form). The spin qubit-type quantum devices 700 disclosed herein may be used to form electron-type or hole-type quantum dots.

Voltages may be applied to each of the gates 706 and 708 separately to adjust the potential energy in the quantum well layer under the gates 706 and 708, and thereby control the formation of quantum dots 742 under each of the gates 706 and 708. Additionally, the relative potential energy profiles under different ones of the gates 706 and 708 allow the spin qubit-type quantum device 700 to tune the potential interaction between quantum dots 742 under adjacent gates. For example, if two adjacent quantum dots 742 (e.g., one quantum dot 742 under a gate 706 and another quantum dot 742 under a gate 708) are separated by only a short potential barrier, the two quantum dots 742 may interact more strongly than if they were separated by a taller potential barrier. Since the depth of the potential wells/height of the potential barriers under each gate 706/708 may be adjusted by adjusting the voltages on the respective gates 706/708, the differences in potential between adjacent gates 706/708 may be adjusted, and thus the interaction tuned.

In some applications, the gates 708 may be used as plunger gates to enable the formation of quantum dots 742 under the gates 708, while the gates 706 may be used as barrier gates to adjust the potential barrier between quantum dots 742 formed under adjacent gates 708. In other applications, the gates 708 may be used as barrier gates, while the gates 706 are used as plunger gates. In other applications, quantum dots 742 may be formed under all the gates 706 and 708, or under any desired subset of the gates 706 and 708.

Vias and lines may contact the gates 706/708 and the doped regions 740 to enable electrical connection to the gates 706/708 and the doped regions 740 to be made in desired locations. As shown in FIG. 14, the gates 706 may extend away from the fins 704, and vias 720 may contact the gates 706 (and are drawn in dashed lines in FIG. 14B to indicate their location behind the plane of the drawing). The vias 720 may extend through the hardmask 716 and the hardmask 718 to contact the gate metal 710 of the gates 706. The gates 708 may extend away from the fins 704, and the vias 722 may contact the gates 708 (also drawn in dashed lines in FIG. 14B to indicate their location behind the plane of the drawing). The vias 722 may extend through the hardmask 718 to contact the gate metal 712 of the gates 708. Vias 736 may contact the interface material 741 and may thereby make electrical contact with the doped regions 740. The spin qubit-type quantum device 700 may include further vias and/or lines (not shown) to make electrical contact to the gates 706/708 and/or the doped regions 740, as desired. The vias and lines included in a spin qubit-type quantum device 700 may include any suitable materials, such as copper, tungsten (deposited, e.g., by chemical vapor deposition (CVD)), or a superconductor (e.g., aluminum, tin, titanium nitride, niobium titanium nitride, tantalum, niobium, or other niobium compounds such as niobium tin and niobium germanium).

During operation, a bias voltage may be applied to the doped regions 740 (e.g., via the vias 736 and the interface material 741) to cause current to flow through the doped regions 740. When the doped regions 740 are doped with an n-type material, this voltage may be positive; when the doped regions 740 are doped with a p-type material, this voltage may be negative. The magnitude of this bias voltage may take any suitable value (e.g., between 0.25 volts and 2 volts).

The spin qubit-type quantum device 700 may include one or more magnet lines 721. For example, a single magnet line 721 is illustrated in FIG. 14 proximate to the fin 704-1. The magnet line 721 may be formed of a conductive material, and may be used to conduct current pulses that generate magnetic fields to influence the spin states of one or more of the quantum dots 742 that may form in the fins 704. In some embodiments, the magnet line 721 may conduct a pulse to reset (or "scramble") nuclear and/or quantum dot spins. In some embodiments, the magnet line 721 may conduct a pulse to initialize an electron in a quantum dot in a particular spin state. In some embodiments, the magnet line 721 may conduct current to provide a continuous, oscillating magnetic field to which the spin of a qubit may couple. The magnet line 721 may provide any suitable combination of these embodiments, or any other appropriate functionality.

In some embodiments, the magnet line 721 may be formed of copper. In some embodiments, the magnet line 721 may be formed of a superconductor, such as aluminum. The magnet line 721 illustrated in FIG. 14 is non-coplanar with the fins 704, and is also non-coplanar with the gates 706/708. In some embodiments, the magnet line 721 may be spaced apart from the gates 706/708 by a distance 767. The distance 767 may take any suitable value (e.g., based on the desired strength of the magnetic field interaction with the quantum dots 742); in some embodiments, the distance 767 may be between 25 nanometers and 1 micron (e.g., between 50 nanometers and 200 nanometers).

In some embodiments, the magnet line 721 may be formed of a magnetic material. For example, a magnetic material (such as cobalt) may be deposited in a trench in the insulating material 730 to provide a permanent magnetic field in the spin qubit-type quantum device 700.

The magnet line 721 may have any suitable dimensions. For example, the magnet line 721 may have a thickness 769 between 25 nanometers and 100 nanometers. The magnet line 721 may have a width 771 between 25 nanometers and 100 nanometers. In some embodiments, the width 771 and thickness 769 of a magnet line 721 may be equal to the width and thickness, respectively, of other conductive pads in the spin qubit-type quantum device 700 (not shown) used to provide electrical interconnects, as known in the art. The magnet line 721 may have a length 773 that may depend on the number and dimensions of the gates 706/708 that are to form quantum dots 742 with which the magnet line 721 is to interact. The magnet line 721 illustrated in FIG. 14 is substantially linear, but this need not be the case; the magnet lines 721 disclosed herein may take any suitable shape. Vias 723 may contact the magnet line 721.

The vias 720, 722, 736, and 723 may be electrically isolated from each other by an insulating material 730. The insulating material 730 may be any suitable material, such as an interlayer dielectric (ILD). Examples of the insulating material 730 may include silicon oxide, silicon nitride, aluminum oxide, carbon-doped oxide, and/or silicon oxynitride. As known in the art of integrated circuit manufacturing, vias and lines may be formed in an iterative process in which layers of structures are formed on top of each other. In some embodiments, the vias 720/722/736/723 may have a width that is 20 nanometers or greater at their widest point (e.g., 30 nanometers), and a pitch of 80 nanometers or greater (e.g., 100 nanometers). In some embodiments, conductive pads (not shown) included in the spin qubit-type quantum device 700 may have a width that is 100 nanometers or greater, and a pitch of 100 nanometers or greater. The particular arrangement of vias shown in FIG. 14 is simply illustrative, and any electrical routing arrangement may be implemented.

As discussed above, the structure of the fin 704-1 may be the same as the structure of the fin 704-2; similarly, the construction of gates 706/708 on the fin 704-1 may be the same as the construction of gates 706/708 on the fin 704-2. The gates 706/708 on the fin 704-1 may be mirrored by corresponding gates 706/708 on the parallel fin 704-2, and the insulating material 730 may separate the gates 706/708 on the different fins 704-1 and 704-2. In particular, quantum dots 742 formed in the fin 704-1 (under the gates 706/708) may have counterpart quantum dots 742 in the fin 704-2 (under the corresponding gates 706/708). In some embodiments, the quantum dots 742 in the fin 704-1 may be used as "active" quantum dots in the sense that these quantum dots 742 act as qubits and are controlled (e.g., by voltages applied to the gates 706/708 of the fin 704-1) to perform quantum computations. The quantum dots 742 in the fin 704-2 may be used as "read" quantum dots in the sense that these quantum dots 742 may sense the quantum state of the quantum dots 742 in the fin 704-1 by detecting the electric field generated by the charge in the quantum dots 742 in the fin 704-1, and may convert the quantum state of the quantum dots 742 in the fin 704-1 into electrical signals that may be detected by the gates 706/708 on the fin 704-2. Each quantum dot 742 in the fin 704-1 may be read by its corresponding quantum dot 742 in the fin 704-2. Thus, the spin qubit-type quantum device 700 enables both quantum computation and the ability to read the results of a quantum computation.

As discussed above, the base 702 and the fin 704 of a spin qubit-type quantum device 700 may be formed from a substrate 744 and a quantum well stack 746 disposed on the substrate 744. The quantum well stack 746 may include a quantum well layer in which a 2DEG may form during operation of the spin qubit-type quantum device 700. The quantum well stack 746 may take any of a number of forms, several of which are illustrated in FIG. 15. The various layers in the quantum well stacks 746 discussed below may be grown on the substrate 744 (e.g., using epitaxial processes).

Figure 15A:
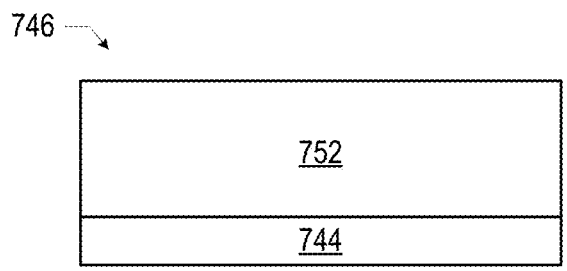
FIGS. 15A-15C are cross-sectional views of various examples of quantum well stacks that may be used in a spin qubit-type quantum device, in accordance with various embodiments.

FIG. 15A is a cross-sectional view of a quantum well stack 746 including only a quantum well layer 752. The quantum well layer 752 may be disposed on the substrate 744, and may be formed of a material such that, during operation of the spin qubit-type quantum device 700, a 2DEG may form in the quantum well layer 752 proximate to the upper surface of the quantum well layer 752. The gate dielectric 714 of the gates 706/708 may be disposed on the upper surface of the quantum well layer 752. In some embodiments, the quantum well layer 752 of FIG. 15A may be formed of intrinsic silicon, and the gate dielectric 714 may be formed of silicon oxide; in such an arrangement, during use of the spin qubit-type quantum device 700, a 2DEG may form in the intrinsic silicon at the interface between the intrinsic silicon and the silicon oxide. Embodiments in which the quantum well layer 752 of FIG. 15A is formed of intrinsic silicon may be particularly advantageous for electron-type spin qubit-type quantum devices 700. In some embodiments, the quantum well layer 752 of FIG. 15A may be formed of intrinsic germanium, and the gate dielectric 714 may be formed of germanium oxide; in such an arrangement, during use of the spin qubit-type quantum device 700, a 2DEG may form in the intrinsic germanium at the interface between the intrinsic germanium and the germanium oxide. Such embodiments may be particularly advantageous for hole-type spin qubit-type quantum devices 700. In some embodiments, the quantum well layer 752 may be strained, while in other embodiments, the quantum well layer 752 may not be strained. The thicknesses (i.e., z-heights) of the layers in the quantum well stack 746 of FIG. 15A may take any suitable values. For example, in some embodiments, the thickness of the quantum well layer 752 (e.g., intrinsic silicon or germanium) may be between 0.8 microns and 1.2 microns.

Figure 15B:
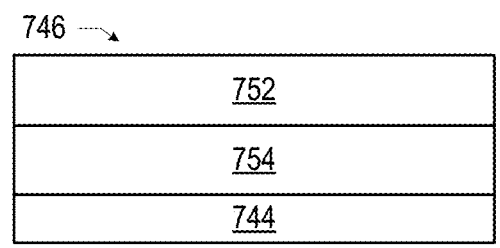

FIG. 15B is a cross-sectional view of a quantum well stack 746 including a quantum well layer 752 and a barrier layer 754. The quantum well stack 746 may be disposed on a substrate 744 such that the barrier layer 754 is disposed between the quantum well layer 752 and the substrate 744. The barrier layer 754 may provide a potential barrier between the quantum well layer 752 and the substrate 744. As discussed above, the quantum well layer 752 of FIG. 15B may be formed of a material such that, during operation of the spin qubit-type quantum device 700, a 2DEG may form in the quantum well layer 752 proximate to the upper surface of the quantum well layer 752. For example, in some embodiments in which the substrate 744 is formed of silicon, the quantum well layer 752 of FIG. 15B may be formed of silicon, and the barrier layer 754 may be formed of silicon germanium. The germanium content of this silicon germanium may be 20-80 atomic-% (e.g., 30%). In some embodiments in which the quantum well layer 752 is formed of germanium, the barrier layer 754 may be formed of silicon germanium (with a germanium content of 20-80 atomic-% (e.g., 70%)). The thicknesses (i.e., z-heights) of the layers in the quantum well stack 746 of FIG. 15B may take any suitable values. For example, in some embodiments, the thickness of the barrier layer 754 (e.g., silicon germanium) may be between 0 nanometers and 400 nanometers. In some embodiments, the thickness of the quantum well layer 752 (e.g., silicon or germanium) may be between 5 nanometers and 30 nanometers.

Figure 15C:
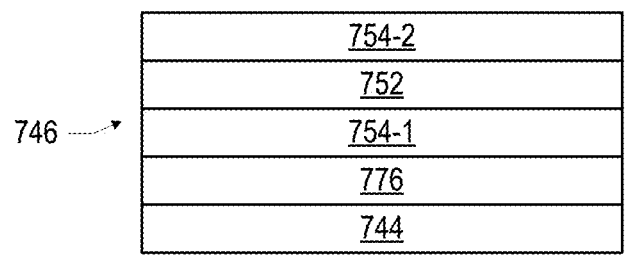

FIG. 15C is a cross-sectional view of a quantum well stack 746 including a quantum well layer 752 and a barrier layer 754-1, as well as a buffer layer 776 and an additional barrier layer 754-2. The quantum well stack 746 may be disposed on the substrate 744 such that the buffer layer 776 is disposed between the barrier layer 754-1 and the substrate 744. The buffer layer 776 may be formed of the same material as the barrier layer 754, and may be present to trap defects that form in this material as it is grown on the substrate 744. In some embodiments, the buffer layer 776 may be grown under different conditions (e.g., deposition temperature or growth rate) from the barrier layer 754-1. In particular, the barrier layer 754-1 may be grown under conditions that achieve fewer defects than the buffer layer 776. In some embodiments in which the buffer layer 776 includes silicon germanium, the silicon germanium of the buffer layer 776 may have a germanium content that varies from the substrate 744 to the barrier layer 754-1; for example, the silicon germanium of the buffer layer 776 may have a germanium content that varies from zero percent at the silicon substrate 744 to a nonzero percent (e.g., 30%) at the barrier layer 754-1. The thicknesses (i.e., z-heights) of the layers in the quantum well stack 746 of FIG. 15C may take any suitable values. For example, in some embodiments, the thickness of the buffer layer 776 (e.g., silicon germanium) may be between 0.3 microns and 4 microns (e.g., 0.3 microns to 2 microns, or 0.5 microns). In some embodiments, the thickness of the barrier layer 754-1 (e.g., silicon germanium) may be between 0 nanometers and 400 nanometers. In some embodiments, the thickness of the quantum well layer 752 (e.g., silicon or germanium) may be between 5 nanometers and 30 nanometers (e.g., 10 nanometers). The barrier layer 754-2, like the barrier layer 754-1, may provide a potential energy barrier around the quantum well layer 752, and may take the form of any of the embodiments of the barrier layer 754-1. In some embodiments, the thickness of the barrier layer 754-2 (e.g., silicon germanium) may be between 25 nanometers and 75 nanometers (e.g., 32 nanometers).

As discussed above with reference to FIG. 15B, the quantum well layer 752 of FIG. 15C may be formed of a material such that, during operation of the spin qubit-type quantum device 700, a 2DEG may form in the quantum well layer 752 proximate to the upper surface of the quantum well layer 752. For example, in some embodiments in which the substrate 744 is formed of silicon, the quantum well layer 752 of FIG. 15C may be formed of silicon, and the barrier layer 754-1 and the buffer layer 776 may be formed of silicon germanium. In some such embodiments, the silicon germanium of the buffer layer 776 may have a germanium content that varies from the substrate 744 to the barrier layer 754-1; for example, the silicon germanium of the buffer layer 776 may have a germanium content that varies from zero percent at the silicon substrate 744 to a nonzero percent (e.g., 30%) at the barrier layer 754-1. In other embodiments, the buffer layer 776 may have a germanium content equal to the germanium content of the barrier layer 754-1 but may be thicker than the barrier layer 754-1 to absorb the defects that arise during growth.

In some embodiments, the quantum well layer 752 of FIG. 15C may be formed of germanium, and the buffer layer 776 and the barrier layer 754-1 may be formed of silicon germanium. In some such embodiments, the silicon germanium of the buffer layer 776 may have a germanium content that varies from the substrate 744 to the barrier layer 754-1; for example, the silicon germanium of the buffer layer 776 may have a germanium content that varies from zero percent at the substrate 744 to a nonzero percent (e.g., 70%) at the barrier layer 754-1. The barrier layer 754-1 may in turn have a germanium content equal to the nonzero percent. In other embodiments, the buffer layer 776 may have a germanium content equal to the germanium content of the barrier layer 754-1 but may be thicker than the barrier layer 754-1 to absorb the defects that arise during growth. In some embodiments of the quantum well stack 746 of FIG. 15C, the buffer layer 776 and/or the barrier layer 754-2 may be omitted.

Any of the quantum computing circuitry discussed above with reference to FIGS. 11-15 may be distributed in any manner between the quantum processing die 104 and the through-hole die 102 in any of the quantum computing assemblies 100 disclosed herein (e.g., any of the quantum computing assemblies 100 discussed herein with reference to FIGS. 1-7). In some embodiments, all of the superconducting-type or spin-type qubit elements may be included in the quantum processing die 104, and the through-hole die 102 may not include such elements.

Figure 16:
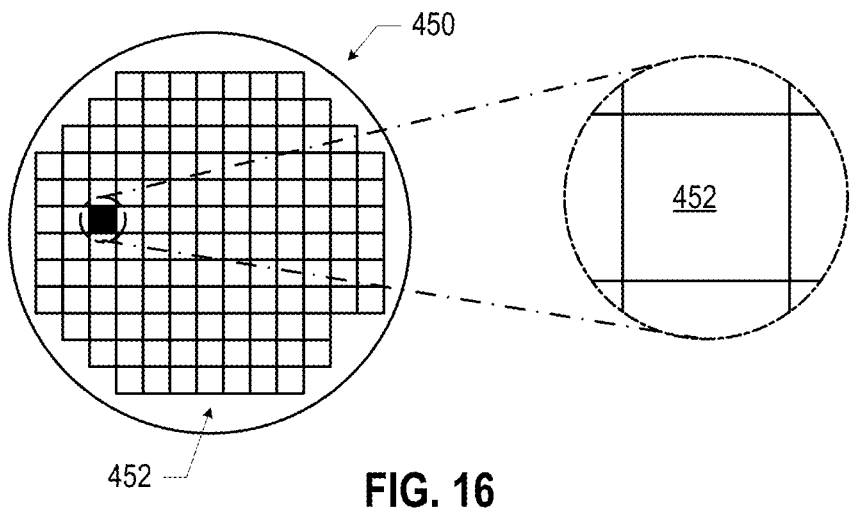
FIG. 16 is a top view of a wafer and dies that may be included in any of the quantum computing assemblies disclosed herein.

FIG. 16 is a top view of a wafer 450 and dies 452 that may be formed from the wafer 450; the dies 452 may be any of the dies discussed herein. The wafer 450 may include semiconductor material and may include one or more dies 452 having conventional and/or quantum computing device elements formed on a surface of the wafer 450. Each of the dies 452 may be a repeating unit of a semiconductor product that includes any suitable conventional and/or quantum computing device. After the fabrication of the semiconductor product is complete, the wafer 450 may undergo a singulation process in which each die 452 is separated from the others to provide discrete "chips" of the semiconductor product. A die 452 may include one or more quantum computing devices (e.g., the devices discussed above with reference to FIGS. 11-15) and/or supporting circuitry to route electrical signals to the quantum computing devices (e.g., interconnects including vias and lines, or control circuitry), as well as any other integrated circuit components. In some embodiments, the wafer 450 or the die 452 may include a memory device (e.g., a static random access memory (SRAM) device), a logic device (e.g., AND, OR, NAND, or NOR gate), or any other suitable circuit element. Multiple ones of these devices may be combined on a single die 452. For example, a memory array formed by multiple memory devices may be formed on a same die 452 as a processing device (e.g., the processing device 2002 of FIG. 17) or other logic that is configured to store information in the memory devices or execute instructions stored in the memory array.

Figure 17:
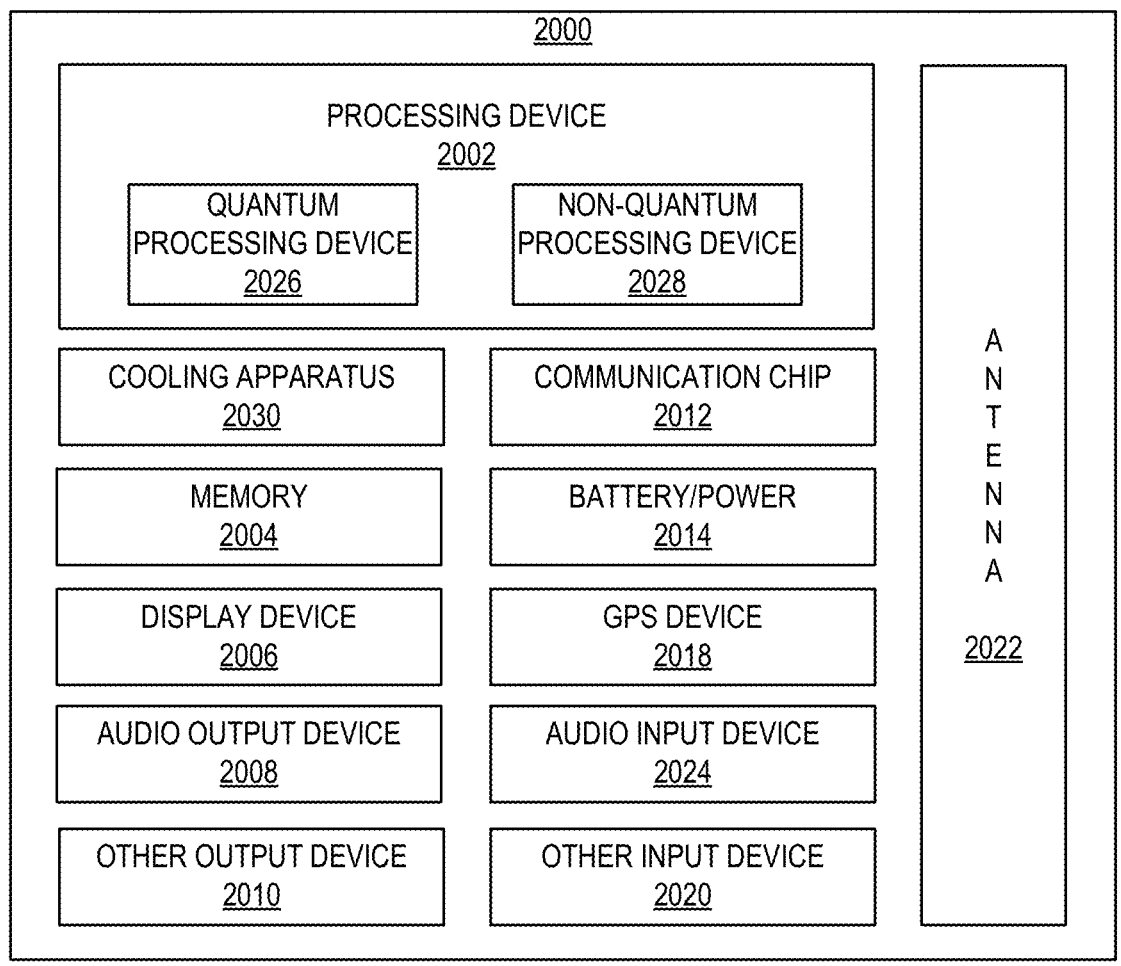
FIG. 17 is a block diagram of an example quantum computing device that may include any of the quantum computing assemblies disclosed herein, in accordance with various embodiments.

FIG. 17 is a block diagram of an example quantum computing device 2000 that may include any of the quantum computing assemblies 100 disclosed herein. A number of components are illustrated in FIG. 17 as included in the quantum computing device 2000, but any one or more of these components may be omitted or duplicated, as suitable for the application. In some embodiments, some or all the components included in the quantum computing device 2000 may be attached to one or more PCBs (e.g., a motherboard). In some embodiments, various ones of these components may be fabricated onto a single system-on-a-chip (SoC) die. Additionally, in various embodiments, the quantum computing device 2000 may not include one or more of the components illustrated in FIG. 17, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2024 or an audio output device 2008, but may include audio input or output device interface circuitry (e.g., connectors and supporting circuitry) to which an audio input device 2024 or audio output device 2008 may be coupled.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include one or more of the dies disclosed herein, and may perform data processing by performing operations on the qubits that may be generated in the dies, and monitoring the result of those operations. For example, as discussed above, different qubits may be allowed to interact, the quantum states of different qubits may be set or transformed, and the quantum states of qubits may be read. The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, control the performance of any of the operations discussed herein, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random access memory (STT-MRAM).

The quantum computing device 2000 may include a cooling apparatus 2030. The cooling apparatus 2030 may maintain the quantum processing device 2026 at a predetermined low temperature during operation to reduce the effects of scattering in the quantum processing device 2026. This predetermined low temperature may vary depending on the setting; in some embodiments, the temperature may be 5 Kelvin or less. In some embodiments, the non-quantum processing device 2028 (and various other components of the quantum computing device 2000) may not be cooled by the cooling apparatus 2030, and may instead operate at room temperature. The cooling apparatus 2030 may be, for example, a dilution refrigerator, a helium-3 refrigerator, or a liquid helium refrigerator.

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc. that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output).

The quantum computing device 2000 may include a GPS device 2018 (or corresponding interface circuitry, as discussed above). The GPS device 2018 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The following paragraphs provide various examples of the embodiments disclosed herein.

Example 1 is a quantum computing assembly, including: a through-hole die having a first surface and an opposing second surface, wherein the through-hole die includes one or more through-holes from the first surface of the through-hole die to the second surface of the through-hole die; a quantum processing die having a first surface and an opposing second surface, wherein the quantum processing die includes quantum processing circuitry, and the second surface of the through-hole die is between the first surface of the through-hole die and the first surface of the quantum processing die; and electrical interconnects between the second surface of the through-hole die and the first surface of the quantum processing die.

Example 2 includes the subject matter of Example 1, and further specifies that the through-hole die includes a superconductor material.

Example 3 includes the subject matter of Example 1, and further specifies that the through-hole die includes quartz.

Example 4 includes the subject matter of Example 1, and further specifies that the through-hole die includes a semiconductor material.

Example 5 includes the subject matter of any of Examples 1-4, and further specifies that the through-hole die further includes: a patterned region at the second surface, wherein the patterned region includes conductive lines or active devices.

Example 6 includes the subject matter of Example 5, and further specifies that the patterned region includes active devices, and the active devices include Josephson junctions.

Example 7 includes the subject matter of any of Examples 5-6, and further specifies that the active devices include amplifiers.

Example 8 includes the subject matter of Example 5, and further specifies that the patterned region includes a quantum well stack and one or more gates.

Example 9 includes the subject matter of any of Examples 1-8, and further specifies that a height of the electrical interconnects between the second surface of the through-hole die and the first surface of the quantum processing die is between 2 microns and 40 microns.

Example 10 includes the subject matter of Example 9, and further specifies that the electrical interconnects include solder.

Example 11 includes the subject matter of any of Examples 1-10, and further specifies that the through-hole die further includes: one or more vias between the first surface and the second surface.

Example 12 includes the subject matter of any of Examples 1-11, and further specifies that a thickness of the through-hole die is between 10 microns and 200 microns.

Example 13 includes the subject matter of any of Examples 1-12, and further specifies that a lateral dimension of the through-hole die is between 5 millimeters and 40 60 millimeters.

Example 14 includes the subject matter of any of Examples 1-13, and further specifies that a lateral dimension of the through-hole die is less than a corresponding lateral dimension of the quantum processing die.

Example 15 includes the subject matter of any of Examples 1-14, and further specifies that the electrical interconnects are first electrical interconnects, and the quantum computing assembly further includes: a package substrate having a first surface and an opposing second surface, wherein the through-hole die is between the package substrate and the quantum processing die; and second electrical interconnects between the second surface of the package substrate and the first surface of the quantum processing die, wherein the second electrical interconnects extend through the through-holes of the through-hole die.

Example 16 includes the subject matter of Example 15, and further specifies that the second electrical interconnects include solder.

Example 17 includes the subject matter of any of Examples 15-16, and further specifies that at least one through-hole has at least two of the second electrical interconnects extending therethrough.

Example 18 includes the subject matter of Example 17, and further specifies that the at least two of the second electrical interconnects are arranged as a central interconnect and two or more interconnects arranged around the central interconnect.

Example 19 includes the subject matter of any of Examples 15-17, and further includes: third electrical interconnects between the second surface of the package substrate and the first surface of the through-hole die.

Example 20 includes the subject matter of any of Examples 15-19, and further includes: underfill material between the through-hole die and the package substrate.

Example 21 includes the subject matter of any of Examples 1-20, and further specifies that the quantum processing die includes qubit elements located closer to the first surface of the quantum processing die than to the second surface of the quantum processing die.

Example 22 includes the subject matter of any of Examples 1-21, and further includes: a mold material between the second surface of the through-hole die and the first surface of the quantum processing die.

Example 23 includes the subject matter of Example 22, and further includes: mold material at side faces of the through-hole die.

Example 24 includes the subject matter of any of Examples 1-23, and further includes: a hermetic seal between the through-hole die and the quantum processing die around at least one of the through-holes.

Example 25 includes the subject matter of any of Examples 1-24, and further includes: a hermetic seal between the through-hole die and the quantum processing die, proximate to a periphery of the through-hole die.

Example 26 is a through-hole die for quantum computing support, including: a first surface and an opposing second surface; and one or more through-holes from the first surface to the second surface; wherein the second surface includes a plurality of conductive contacts for making electrical contact with corresponding conductive contacts of a quantum computing die.

Example 27 includes the subject matter of Example 26, and further specifies that the through-hole die includes a superconductor material.

Example 28 includes the subject matter of Example 26, and further specifies that the through-hole die includes quartz.

Example 29 includes the subject matter of Example 26, and further specifies that the through-hole die includes a semiconductor material.

Example 30 includes the subject matter of any of Examples 26-29, and further includes: a patterned region at the second surface, wherein the patterned region includes conductive lines or active devices.

Example 31 includes the subject matter of Example 30, and further specifies that the patterned region includes active devices, and the active devices include Josephson junctions.

Example 32 includes the subject matter of any of Examples 30-31, and further specifies that the active devices include amplifiers.

Example 33 includes the subject matter of Example 30, and further specifies that the patterned region includes a quantum well stack and one or more gates.

Example 34 includes the subject matter of any of Examples 26-33, and further specifies that the first surfaces includes a plurality of conductive contacts for making electrical contact with corresponding conductive contacts of a package substrate.

Example 35 includes the subject matter of any of Examples 26-34, and further includes: one or more vias between the first surface and the second surface.

Example 36 includes the subject matter of any of Examples 26-35, and further specifies that a thickness of the through-hole die is between 10 microns and 200 microns.

Example 37 includes the subject matter of any of Examples 26-36, and further specifies that a lateral dimension of the through-hole die is between 5 millimeters and 40 millimeters.

Example 38 includes the subject matter of any of Examples 26-37, and further includes: solder on the plurality of conductive contacts at the second surface.

Example 39 includes the subject matter of Example 38, and further specifies that the solder has a height between 2 microns and 40 microns.

Example 40 is a quantum computing device, including: a quantum computing assembly, wherein the quantum computing assembly includes a package substrate, a quantum processing die, and a through-hole die between the package substrate and the quantum processing die, the quantum processing die is electrically coupled to the package substrate by interconnects extending through through-holes of the through-hole die, and the quantum processing die includes qubit elements; and a non-quantum processing die, communicatively coupled to the quantum processing die, to control voltages applied to the qubit elements.

Example 41 includes the subject matter of Example 40, and further includes: a memory device to store data generated by the qubit elements during operation of the quantum processing die.

Example 42 includes the subject matter of Example 41, and further specifies that the memory device is to store instructions for a quantum computing algorithm to be executed by the quantum processing die.

Example 43 includes the subject matter of any of Examples 40-42, and further includes: a cooling apparatus to maintain a temperature of the quantum processing die below 5 Kelvin.

Example 44 includes the subject matter of any of Examples 40-43, and further specifies that the quantum computing assembly further includes: underfill material between the through-hole die and the package substrate.

Example 45 includes the subject matter of any of Examples 40-44, and further specifies that the package substrate includes an organic material.

Example 46 includes the subject matter of any of Examples 40-45, and further specifies that the quantum computing assembly further includes: hermetic seals between the through-hole die and the quantum processing die, around the through-holes.

Example 47 is a method of manufacturing a quantum computing assembly, including: etching recesses in a first wafer to form a recessed surface; coupling the recessed surface to a second wafer, wherein the second wafer includes qubit elements; and singulating the second wafer.

Example 48 includes the subject matter of Example 47, and further includes: before coupling the recessed surface to the second wafer, grinding a backside of the etched first wafer to form wafer portions having through-holes; wherein coupling the recessed surface to the second wafer includes coupling the recessed surfaces of the wafer portions to the second wafer.

Example 49 includes the subject matter of Example 47, and further includes: after coupling the recessed surface to the second wafer, grinding a backside of the etched first wafer to form wafer portions with through-holes.

Example 50 includes the subject matter of Example 47, and further includes: before coupling the recessed surface to the second wafer, singulating the etched first wafer to form wafer portions; wherein coupling the recessed surface to the second wafer includes coupling the recessed surfaces of the wafer portions to the second wafer.

Example 51 includes the subject matter of Example 50, and further includes: after coupling the recessed surface to the second wafer, providing a mold material between the recessed surface and the second wafer, and between the wafer portions.

Example 52 includes the subject matter of any of Examples 50-51, and further includes: after coupling the recessed surface to the second wafer, grinding a backside of the etched first wafer to form wafer portions with through-holes.

Example 53 includes the subject matter of Example 52, and further specifies that providing a mold material is performed before grinding the backside of the etched first wafer.

Example 54 includes the subject matter of any of Examples 47-53, and further includes: forming solder interconnects between the singulated second wafer and a package substrate.

Example 55 includes the subject matter of any of Examples 47-54, and further includes: plating solder on the first wafer before coupling the recessed surface to the second wafer.

The invention claimed is:

1. A quantum computing assembly, comprising:
   a through-hole die having a first surface and an opposing second surface, wherein the through-hole die includes one or more through-holes from the first surface of the through-hole die to the second surface of the through-hole die;
   a quantum processing die having a first surface and an opposing second surface, wherein the quantum processing die includes quantum processing circuitry, and the second surface of the through-hole die is between the first surface of the through-hole die and the first surface of the quantum processing die; and
   electrical interconnects between the second surface of the through-hole die and the first surface of the quantum processing die.

2. The quantum computing assembly of claim 1, wherein the electrical interconnects are first electrical interconnects, and the quantum computing assembly further includes:
   a package substrate having a first surface and an opposing second surface, wherein the through-hole die is between the package substrate and the quantum processing die; and
   second electrical interconnects between the second surface of the package substrate and the first surface of the quantum processing die, wherein the second electrical interconnects extend through the through-holes of the through-hole die.

3. The quantum computing assembly of claim 2, wherein the second electrical interconnects include solder.

4. The quantum computing assembly of claim 2, wherein at least one through-hole has at least two of the second electrical interconnects extending therethrough.

5. The quantum computing assembly of claim 4, wherein the at least two of the second electrical interconnects are arranged as a central interconnect and two or more interconnects arranged around the central interconnect.

6. The quantum computing assembly of claim 2, further comprising:
   third electrical interconnects between the second surface of the package substrate and the first surface of the through-hole die.

7. The quantum computing assembly of claim 1, wherein the quantum processing die includes qubit elements located closer to the first surface of the quantum processing die than to the second surface of the quantum processing die.

8. The quantum computing assembly of claim 1, further comprising:
   a hermetic seal between the through-hole die and the quantum processing die around at least one of the through-holes.

9. The quantum computing assembly of claim 1, further comprising:
   a hermetic seal between the through-hole die and the quantum processing die, proximate to a periphery of the through-hole die.

10. A through-hole die for quantum computing support, comprising:
    a first surface and an opposing second surface; and
    one or more through-holes from the first surface to the second surface;
    wherein the second surface includes a plurality of conductive contacts for making electrical contact with corresponding conductive contacts of a quantum computing die.

11. The through-hole die of claim 10, wherein the through-hole die includes a superconductor material.

12. The through-hole die of claim 10, wherein the through-hole die includes quartz.

13. The through-hole die of claim 10, wherein the through-hole die includes a semiconductor material.

14. The through-hole die of claim 10, further comprising:
    a patterned region at the second surface, wherein the patterned region includes conductive lines or active devices.

15. The through-hole die of claim 14, wherein the patterned region includes active devices, and the active devices include Josephson junctions.

16. The through-hole die of claim 10, further comprising:
    one or more vias between the first surface and the second surface.

17. A quantum computing device, comprising:
    a quantum computing assembly, wherein:
      the quantum computing assembly includes a package substrate, a quantum processing die, and a through-hole die between the package substrate and the quantum processing die,
      the quantum processing die is electrically coupled to the package substrate by interconnects extending through through-holes of the through-hole die, and
      the quantum processing die includes qubit elements; and
    a non-quantum processing die, communicatively coupled to the quantum processing die, to control voltages applied to the qubit elements.

18. The quantum computing device of claim 17, further comprising:
    a memory device to store data generated by the qubit elements during operation of the quantum processing die.

19. The quantum computing device of claim 17, wherein the package substrate includes an organic material.

20. The quantum computing device of claim 17, wherein the quantum computing assembly further includes:
    hermetic seals between the through-hole die and the quantum processing die, around the through-holes.

* * * * *